(12) United States Patent
Koc et al.

(10) Patent No.: US 7,644,619 B2
(45) Date of Patent: Jan. 12, 2010

(54) PIEZOELECTRIC VIBRATOR AND ULTRASONIC MOTOR HAVING PIEZOELECTRIC VIBRATOR

(75) Inventors: Burhanettin Koc, Seongnam-si (KR); Sung-Won Min, Seoul (KR); Dong-Kyun Lee, Seoul (KR); Jung-Ho Ryu, Suwon-si (KR)

(73) Assignee: Samsung Electro Mechanics Co., Ltd, Suwon (KR)

( * ) Notice: Subject to any disclaimer, the term of this patent is extended or adjusted under 35 U.S.C. 154(b) by 456 days.

(21) Appl. No.: 11/436,770

(22) Filed: May 19, 2006

(65) Prior Publication Data
US 2006/0283253 A1 Dec. 21, 2006

(30) Foreign Application Priority Data
May 20, 2005 (KR) .................. 10-2005-0042711

(51) Int. Cl.
*G01M 3/32* (2006.01)
(52) U.S. Cl. .......................... 73/662; 73/570
(58) Field of Classification Search .......... 73/662, 73/587, 649, 664, 570
See application file for complete search history.

(56) References Cited

U.S. PATENT DOCUMENTS

| | | | |
|---|---|---|---|
| 5,672,930 A * | 9/1997 | Narisawa et al. | 310/323.03 |
| 5,824,903 A * | 10/1998 | Nakamura et al. | 73/514.34 |
| 6,643,906 B2 * | 11/2003 | Kitajima et al. | 29/419.1 |
| 6,724,607 B2 * | 4/2004 | Hayashi et al. | 361/171 |
| 6,812,618 B2 * | 11/2004 | Hayashi | 310/316.01 |
| 6,989,624 B2 * | 1/2006 | Tsukimoto et al. | 310/323.12 |
| 7,015,623 B2 * | 3/2006 | Nitto | 310/323.01 |
| 7,215,063 B2 * | 5/2007 | Tsukimoto et al. | 310/323.12 |
| 7,233,096 B2 * | 6/2007 | Maruyama et al. | 310/323.02 |
| 7,301,259 B2 * | 11/2007 | Maruyama et al. | 310/323.11 |
| 2002/0096971 A1 * | 7/2002 | Tsukimoto | 310/323.03 |
| 2002/0101134 A1 * | 8/2002 | Tsukimoto et al. | 310/323.03 |
| 2002/0113675 A1 * | 8/2002 | Kato et al. | 335/80 |
| 2005/0104476 A1 * | 5/2005 | Maruyama et al. | 310/328 |
| 2005/0212385 A1 * | 9/2005 | Tsukimoto et al. | 310/323.04 |
| 2006/0043845 A1 * | 3/2006 | Maruyama et al. | 310/358 |
| 2006/0238076 A1 * | 10/2006 | Sato et al. | 310/329 |
| 2006/0267454 A1 * | 11/2006 | Ashizawa et al. | 310/323.02 |

FOREIGN PATENT DOCUMENTS

| | | |
|---|---|---|
| CN | 1597145 A | 3/2005 |
| JP | 63-294281 | 11/1988 |

(Continued)

OTHER PUBLICATIONS

Translation of JP 07-039172.*

(Continued)

*Primary Examiner*—Hezron Williams
*Assistant Examiner*—Samir M Shah

(57) ABSTRACT

A piezoelectric vibrator and an ultrasonic motor having the piezoelectric vibrator. A piezoelectric vibrator has a multilayered piezoelectric actuator, with special internal and surface electrodes making the body vibrate in a longitudinal and bending direction when an electrical signal is inputted. It can be manufactured using conventional multilayer piezoelectric actuator manufacturing techniques, therefore, it has reduced manufacturing time and cost, as it is not necessary to go through two polarization processes, and may simplify and decrease the volume, while improving the vibration performance.

8 Claims, 23 Drawing Sheets

FOREIGN PATENT DOCUMENTS

JP        7-39172        2/1995

OTHER PUBLICATIONS

Japanese Patent Office Action, mailed Aug. 5, 2008 and issued in corresponding Japanese Patent Application No. 2006-139446 cited Japanese Patent Publication No. 63-294281 (Reference AG).

Korean Patent Office Notice of Preliminary Rejection, dated Sep. 21, 2006, and issued in priority Korean Patent Application No. 2005-0042711.

Japanese Patent Office Action, mailed Aug. 5, 2008 and issued in corresponding Japanese Patent Application No. 2006-139446.

Chinese Office Action issued May 15, 2009 in corresponding Chinese Patent Application 2006100811435.

Korean Patent Office Notice of Preliminary Rejection, dated Sep. 21, 2006, and issued in priority Korean Patent Application No. 2005-0042711 cites as a reference Japanese Published Patent No. 7-39172 (Reference AG).

* cited by examiner

FIG. 1 – PRIOR ART

PIEZOELECTRIC VIBRATOR AND ULTRASONIC MOTOR HAVING PIEZOELECTRIC VIBRATOR

CROSS-REFERENCE TO RELATED APPLICATION

This application claims the benefit of Korean Patent Application No. 2005-42711 filed with the Korea Industrial Property Office on May 20, 2005, the disclosure of which is incorporated herein by reference.

BACKGROUND

1. Technical Field

The present invention relates to a piezoelectric vibrator and an ultrasonic motor having the piezoelectric vibrator, more specifically to a piezoelectric vibrator and an ultrasonic motor having the piezoelectric vibrator that have simple compositions and small volumes and can improve vibration performance.

2. Description of the Related Art

Recently, the ultrasonic motor has received attention as a motor that does not require wound coils, to be suitable, for example, for decreasing the size of a device. The ultrasonic motor is widely used, as it entails low power consumption, has a light weight, provides linear motion directly without gears, allows the control of speed and position electrically, and allows movement in either the forward or reverse direction.

FIG. 1 is a plan view of a piezoelectric vibrator 10 used in a conventional ultrasonic motor.

A conventional piezoelectric vibrator 10 comprises a rectangular piezoelectric element 13 made of piezoelectric ceramic, etc., and a protrusion part 11 formed on a side of the piezoelectric element 13. The protrusion part 11 applies pressure on the object of vibration (not shown), where the protrusion part 11 moves the object of vibration due to the vibration of the piezoelectric element 13. There are four polarization regions, i.e. a first polarization region 13a, second polarization region 13b, third polarization region 13c, and fourth polarization region 13d, formed on the piezoelectric element 13, where all polarization regions 13a, 13b, 13c, 13d have the same polarization direction in the direction of thickness. The four polarization regions 13a, 13b, 13c, 13d have the same size and are arranged in two rows. On each of the four polarization regions 13a, 13b, 13c, 13d is formed an electrode.

The first and fourth polarization regions 13a, 13d have the same polarization direction, while the second and third polarization regions 13b, 13c have a polarization direction opposite to that of the first polarization region 13a. Also, the first and fourth polarization regions 13a, 13d and the second and third polarization regions 13b, 13c are connected respectively by a lead wire 17.

The piezoelectric element 13 vibrates in longitudinal and bending directions when an electric current is supplied to the first and fourth polarization regions 13a, 13d. Similarly; when an electric current is supplied to the second and third polarization regions, 13b, 13c, the piezoelectric element 13 vibrates in longitudinal and bending directions however, this time the direction of bending vibration is opposite to previous case.

Since the conventional piezoelectric vibrator 10 has two polarization directions on one piezoelectric element 13, as described above, two polarization processes are required. This entails the problems of increased manufacturing time and cost of the piezoelectric element. In particular, if the two polarization processes are performed separately on one piezoelectric element 13, depolarization may occur on the portions where the polarization is performed first, to consequently lower the performance of the piezoelectric element 13.

Further, in the conventional piezoelectric vibrator 10, only one pair of polarization regions 13a, 13d positioned diagonally are excited, while the other pair 13b, 13c are not, which lowers the vibration performance of the piezoelectric vibrator 10. This means that a higher voltage must be supplied to improve the vibration performance of the conventional piezoelectric vibrator 10. Moreover, to improve vibration performance, the conventional piezoelectric vibrator 10 was used with the piezoelectric elements 13 stacked in multiple layers, which incurs the problem of increased volume of the piezoelectric element.

Also, polarization involves supplying a high DC voltage to a piezoelectric element 13 to arrange the dipoles within the piezoelectric element 13 into a desired orientation, and during the polarization process, large amounts of stress are concentrated on the boundaries of the electrodes positioned in-between the stacked piezoelectric elements 13. Such stress becomes a major cause of cracks later during the operation of the piezoelectric vibrator 10, and deteriorates the properties of the piezoelectric element 13.

SUMMARY

As a solution to the foregoing problems, an aspect of the invention provides a piezoelectric vibrator and an ultrasonic motor having the piezoelectric vibrator, with which the manufacturing time and cost are reduced, as it is not necessary to go through two polarization processes.

Another aspect of the invention provides a piezoelectric vibrator and an ultrasonic motor having the piezoelectric vibrator, with which the volume may be decreased, while also providing a simple composition and improved vibration performance.

Additional aspects and advantages of the present general inventive concept will be set forth in part in the description which follows and, in part, will be obvious from the description, or may be learned by practice of the general inventive concept.

A piezoelectric vibrator according to a first disclosed embodiment of the invention comprises an elastic member having a quadrilateral cross section, and a piezoelectric element attached to each side of the elastic member and vibrating the elastic member in a longitudinal direction and a bending direction when an electrical signal is inputted, where the piezoelectric elements may have the same size and may be shorter than the elastic member.

Since a piezoelectric vibrator having such a composition uses piezoelectric elements having a single polarization direction, the manufacturing time and cost of the piezoelectric vibrator may be reduced. In addition, since the piezoelectric elements attached respectively to each side of the elastic member vibrate simultaneously, the vibration performance may be improved and the volume of the piezoelectric vibrator may be decreased. Also, since the piezoelectric elements vibrate the elastic member, a greater rigidity may be provided compared to conventional piezoelectric vibrators.

The pair of piezoelectric elements attached to opposing sides of the elastic member may be polarized in the same direction, while the other pair may be polarized in opposite directions. Thus, one pair of piezoelectric elements may make the whole vibrator body vibrate in a longitudinal direction, while the other pair of piezoelectric elements may make the whole vibrator body vibrate in a bending direction. Therefore, the combination of longitudinal motion and bending motion may cause an end of the elastic member to move in an elliptical trajectory.

One end of the piezoelectric element may be aligned with one end of the elastic member to concentrate the vibration on one end of the elastic member. Further, one edge of the piezoelectric element may be trimmed and the trimmed edge may be positioned to face outward, so as to prevent short circuits between the piezoelectric elements.

Preferably, the length of the elastic member may be twice the length of the piezoelectric element, to maximize the vibration of the elastic member. Since voltages with a phase difference of 90° are supplied respectively to the pair of piezoelectric elements attached to opposing sides of the elastic member and the other pair of piezoelectric elements, one pair may vibrate in a bending direction, and the other pair may vibrate in a longitudinal direction.

A piezoelectric vibrator according to a second disclosed embodiment of the invention comprises a pair of first piezoelectric elements, having the same rectangular parallelepiped shape and polarized in opposite directions, and a pair of second piezoelectric elements, having the same rectangular parallelepiped shape and respectively attached to a side of the first piezoelectric element, and polarized in the same direction, where the first piezoelectric elements may be longer than the second piezoelectric elements, and the first piezoelectric elements may vibrate in a longitudinal direction while the second piezoelectric elements may vibrate in a bending direction when electrical signals are inputted.

Since the piezoelectric vibrator according to the disclosed embodiments of the invention uses piezoelectric elements having a single polarization direction, the manufacturing time and cost of the piezoelectric vibrator may be reduced. In addition, since the piezoelectric elements attached respectively to each side of the elastic member vibrate simultaneously, the vibration performance may be improved and the volume of the piezoelectric vibrator may be decreased. Also, since only the piezoelectric elements are used, the piezoelectric vibrator may be produced with greater ease in manufacture.

By aligning one end of each of the second piezoelectric elements with one end of a first piezoelectric element, the displacement may be maximized on one end of each of the second piezoelectric elements, and by attaching each of the second piezoelectric elements to the center of a first piezoelectric element, both ends of the second piezoelectric element may be made to vibrate.

It may be preferable for the length of the first piezoelectric element to be twice the length of the second piezoelectric element, to maximize the amount of vibration of the first piezoelectric element. Also, since voltages with a phase difference of 90° are supplied respectively to the first piezoelectric elements and the second piezoelectric elements, the first and second piezoelectric elements may vibrate in the longitudinal and bending directions simultaneously.

A piezoelectric vibrator according to a fourth disclosed embodiment of the invention comprises multiple layers of piezoelectric elements having one polarization direction, conductive electrodes formed on both faces of the piezoelectric elements and interconnected to one another, and a protrusion part formed on a side of the piezoelectric elements, where the adjacent piezoelectric elements may be polarized respectively in two opposite directions, and the electrodes may be interconnected.

Since the piezoelectric vibrator according to the fourth disclosed embodiment of the invention uses piezoelectric elements having a single polarization direction, the manufacturing time and cost of the piezoelectric vibrator may be reduced. Also, since the piezoelectric elements vibrate simultaneously, the vibration performance may be improved, and the volume of the piezoelectric vibrator may be decreased.

By supplying a 4-phase electrical signal to the conductive electrode, the magnitude of the electrical signal may be increased further.

An ultrasonic motor according to a fifth disclosed embodiment of the invention is equipped with a piezoelectric vibrator of any of the first to fourth disclosed embodiments, and comprises a case into which the piezoelectric vibrator is inserted, a slider inserted into the case to be movable in vertical directions and moving in contact with the piezoelectric vibrator, a first pressing member for pressing the piezoelectric vibrator towards the slider, and a second pressing member for pressing the slider towards the piezoelectric vibrator.

The ultrasonic motor according to the fifth disclosed embodiment of the invention has a decreased volume, and can increase the amount of vibration with a lower voltage. Also, since the piezoelectric vibrator and the slider are held together steadily by the first and second pressing members, the vibration of the piezoelectric vibrator is efficiently transferred to the slider.

The first pressing member may have a circular cross section and may be pressed towards the sliders by a flat spring inserted into the case, to hold the piezoelectric vibrator and the slider together more steadily.

The case may comprise a vibrator housing part into which the piezoelectric vibrator is inserted, slider insertion holes leading to the vibrator housing part through which the sliders are inserted, first pressing member fitting grooves formed on one end of the case in a pre-determined depth into which the first pressing member is inserted to contact one end of the piezoelectric vibrator, second pressing member insertion holes formed perpendicularly to the slider insertion holes through which the second pressing member is inserted to contact the slider, and spring insertion grooves formed perpendicularly to the first pressing member fitting grooves through which the flat spring is inserted to contact the first pressing member.

BRIEF DESCRIPTION OF THE DRAWINGS

These and/or other aspects and advantages of the present general inventive concept will become apparent and more readily appreciated from the following description of the disclosed embodiments, taken in conjunction with the accompanying drawings of which.

DETAILED DESCRIPTION

Hereinafter, embodiments of the present invention will be described in more detail with reference to the accompanying drawings.

Figure 1:
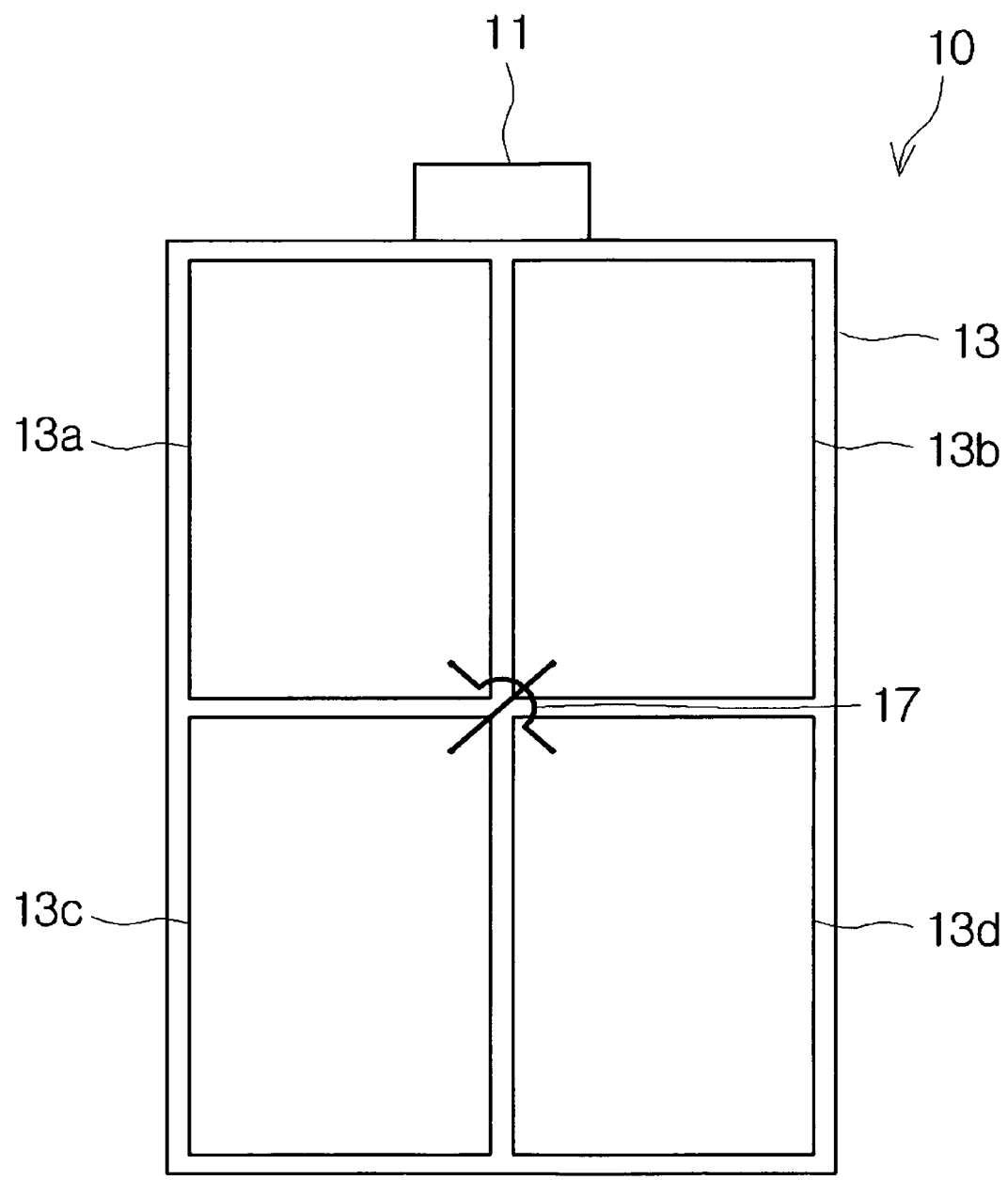
FIG. 1 is a plan view of a conventional piezoelectric vibrator.
Figure 2:
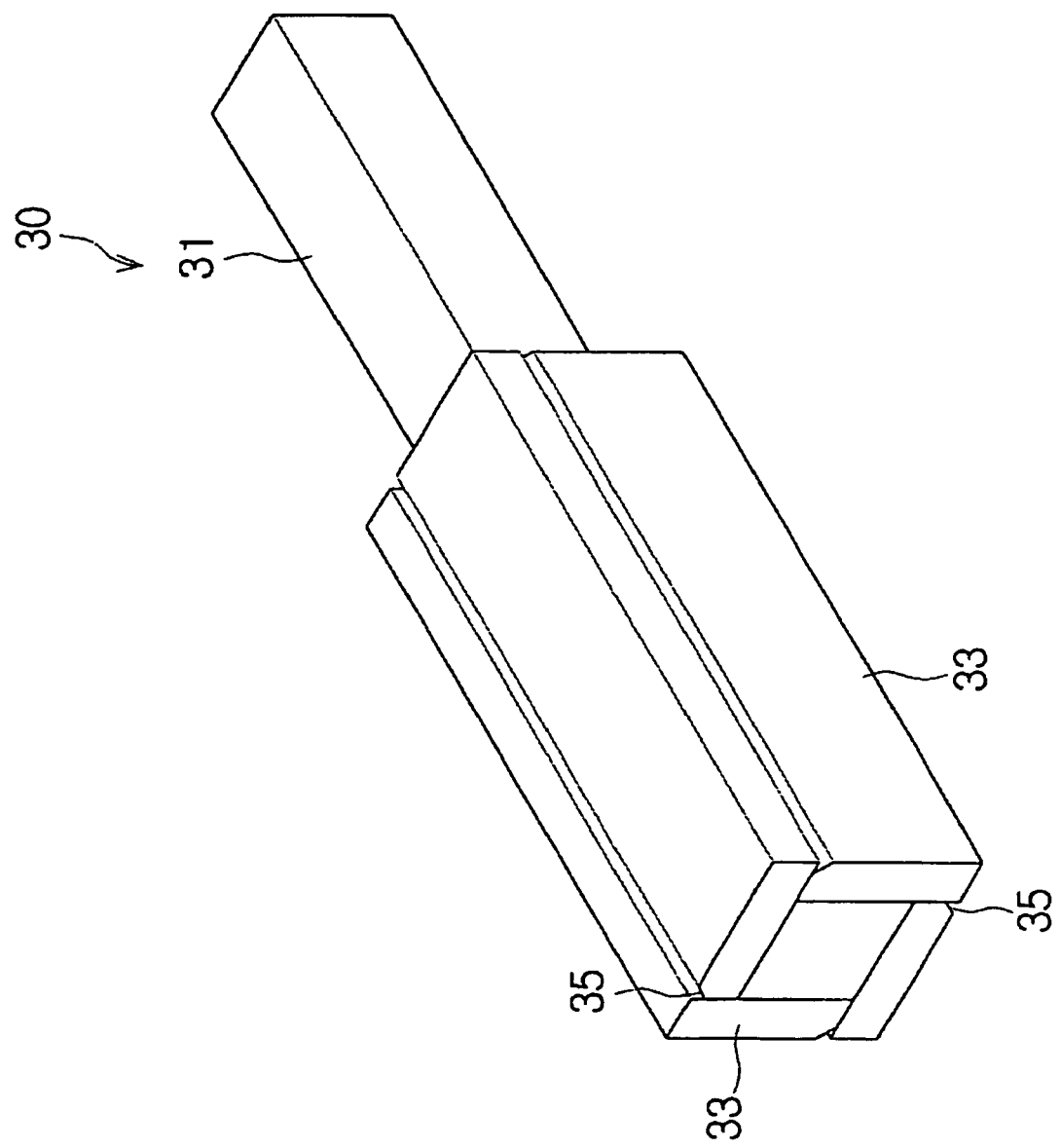
FIG. 2 is a perspective view of a piezoelectric vibrator according to a first disclosed embodiment of the invention.

FIG. 2 is a perspective view of a piezoelectric vibrator according to a first disclosed embodiment of the invention. The piezoelectric vibrator 30 according to the first disclosed embodiment comprises an elastic member 31, having a constant length and a quadrilateral cross section, and four piezoelectric elements 33, having the same size and attached respectively to each side of the elastic member 31.

When an electrical signal is inputted to the piezoelectric element 33 and vibration occurs, the elastic member 31 vibrates in a longitudinal direction or a bending direction, so that consequently the end of the elastic member vibrates in an elliptical trajectory. This causes the object of vibration (not shown) in contact with the end of the elastic member 31 to vibrate, due to the frictional force with the elastic member 31.

The elastic member 31 may be made from any material having elastic force, for example, brass or stainless steel, etc. It is preferable that the length of the elastic member 31 be twice the length of the piezoelectric elements to maximize the vibration generated on the elastic member 31. Also, as illustrated in FIG. 2, by aligning the piezoelectric elements 33 with one end of the elastic member 31, the vibration generated on the other end of the elastic member 31 may be maximized.

Although in the first disclosed embodiment the elastic member 31 is described as having a quadrilateral cross section, the present invention is not thus limited, and an elastic member 31 having any cross section may be used that can vibrate in the longitudinal direction or bending direction using the vibration of the piezoelectric elements 33. For example, an elastic member may be used that has an octagonal cross section, with the neighboring piezoelectric elements positioned respectively on each side of the elastic member arranged to have opposite polarization directions.

All of the piezoelectric elements 33 have the same size and are attached respectively on each side of the elastic member 31 by means of epoxy resin, etc. The length of the piezoelectric elements 33 corresponds to half the length of the elastic member 31. Also, when the piezoelectric elements 33 are attached respectively to each side of the elastic member 31, as shown in FIG. 2, the assembled cross section of the four piezoelectric elements 33 forms a quadrilateral. The thickness of the piezoelectric elements 33 is determined depending on the size and shape of the piezoelectric elements 33.

The piezoelectric element 33 is formed from a material having a piezoelectric effect (a piezoelectric material). Suitable examples may include PZT-based ceramics and PbTiO3-based ceramics, etc. Suitable examples of PZT-based ceramics may include PZT and $Pb(Ni_{1/3}Nb_{2/3})O_3$-$Pb(Zn_{1/3}Nb_{2/3})O_3$-$PbTiO_3$-$PbZrO_3$ ceramics. The piezoelectric element 33 has unique vibration characteristics, where a strong vibration is generated when the frequency of the electrical signal inputted to the piezoelectric element 33 coincides with the characteristic frequency of the piezoelectric element.

A conductive electrode (not shown) is attached on one face of the piezoelectric element 33, and the electrical signal is inputted to the electrode. On one face of the piezoelectric element 33 is formed a polishing part 35, trimmed by mechanical processing, etc. This prevents short circuits between the electrodes of each of the adjoining piezoelectric elements 33.

Figure 3:
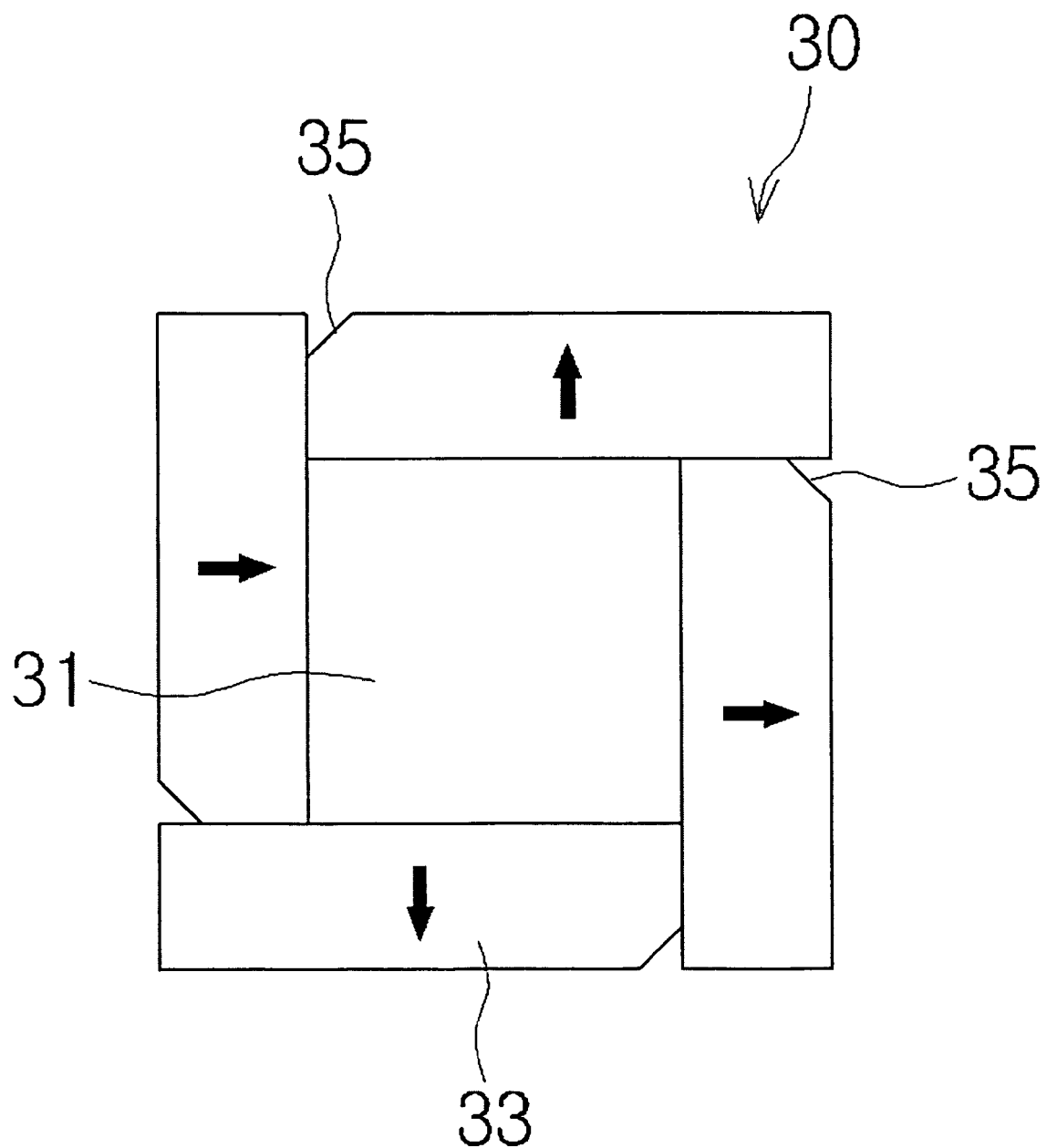
FIG. 3 is a schematic diagram illustrating the polarization directions of piezoelectric elements in a piezoelectric vibrator according to a first disclosed embodiment of the invention.

FIG. 3 is a schematic diagram illustrating the polarization directions of piezoelectric elements 33 in a piezoelectric vibrator 30 according to the first disclosed embodiment of the invention.

As shown in FIG. 3, one pair of piezoelectric elements 33 attached to opposing sides of the elastic member 31 are polarized in the same direction, to vibrate in a bending direction with the input of an electrical signal. Also, the other pair of piezoelectric elements 33 attached to opposing sides of the elastic member 31 are polarized in opposite directions, to vibrate in a longitudinal direction with the input of an electrical signal. Electrical signals having a phase difference of 90° are inputted to each pair of the piezoelectric elements. For example, a voltage having a frequency of sin ωt (where ω is angular frequency) may be supplied to the pair of piezoelectric elements polarized in the same direction, while a voltage having a frequency of cos ωt (where ω is angular frequency) may be supplied to the pair of piezoelectric elements polarized in opposite directions.

As seen in FIG. 3, the piezoelectric element 33 has a single polarization direction, unlike the conventional piezoelectric element 13, to provide the advantages of easy manufacture of the piezoelectric element and low manufacturing cost. Moreover, as will be described hereafter, since all of the piezoelectric elements 33 are excited during the vibration of the piezoelectric vibrator 30, the magnitude of the vibration may be increased.

Figure 4:
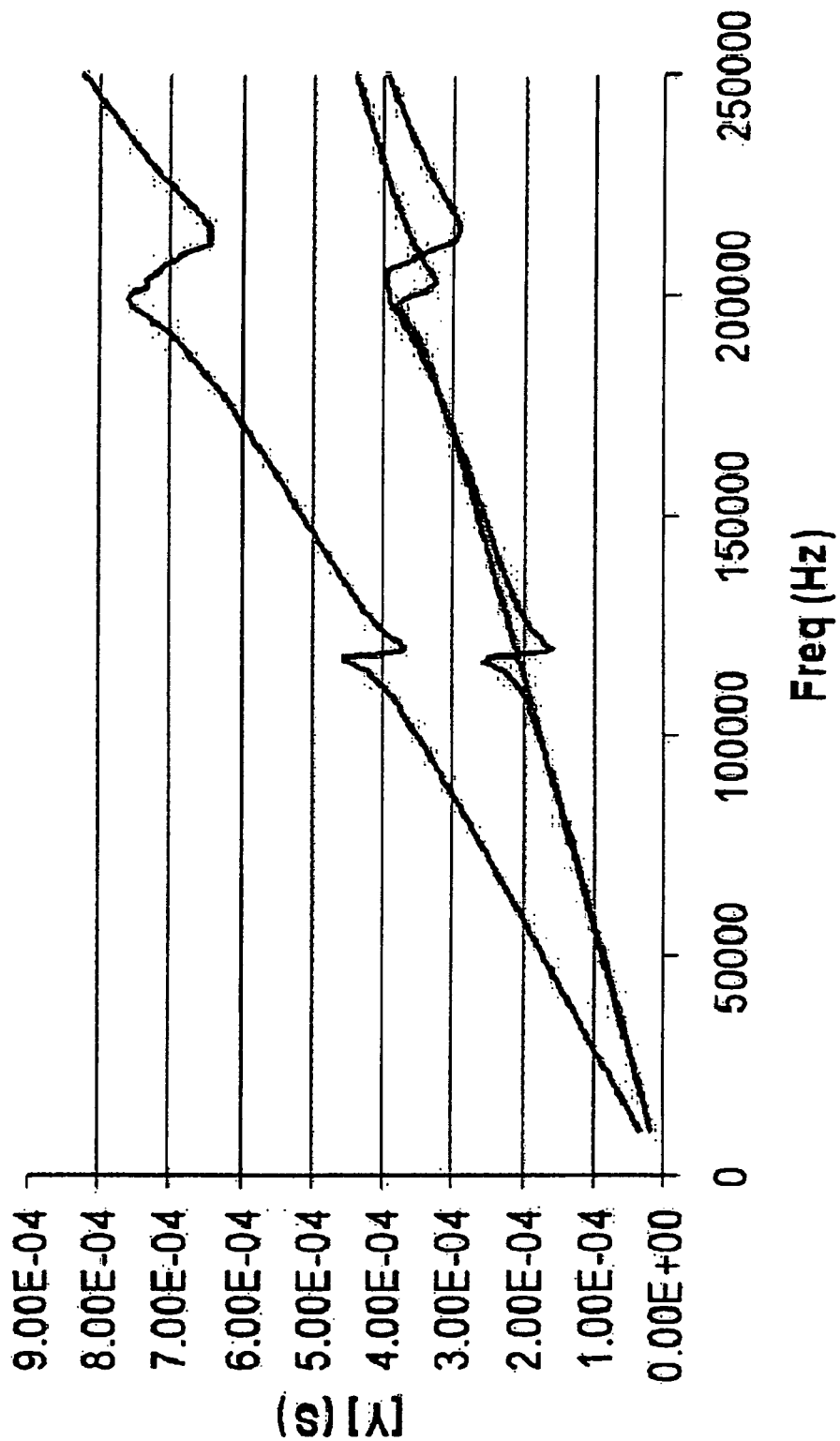
FIG. 4 is a graph illustrating the admittances of the piezoelectric elements with respect to changes in frequency, in a piezoelectric vibrator according to a first disclosed embodiment of the invention.

FIG. 4 is a graph illustrating the admittances of the piezoelectric elements with respect to changes in frequency of the signals supplied to a piezoelectric vibrator 30 according to the first disclosed embodiment. Here, the elastic member 31 is made of brass, having a length of 8.0 mm and a square cross section with a length of 0.7 mm for each side. The piezoelectric elements have a length of 4.0 mm, a width of 1.0 mm, and a thickness of 0.3 mm. In FIG. 4, the horizontal axis represents the frequency of the signals supplied to the piezoelectric element 33, and the vertical axis represents the admittance, in units of $$S = \frac{A}{V} [\text{siemens}].$$

Also, in FIG. 4, one of the overlapping curves that has two peaks around 110 kHz and 200 kHz represents the admittance measured by an impedance analyzer for the pair of piezoelectric elements polarized in opposite directions and the peaks represent second and third bending modes, while the other overlapping curve that has single peak at around 200 kHz represents the admittance of the other pair of piezoelectric elements polarized in the same direction and the single peak represent first longitudinal mode. The curve above the two overlapping curves is the total admittance of the vibrator, where first longitudinal and third bending modes are combined around 200 kHz.

The higher the admittance of the piezoelectric element 33, i.e. the lower the impedance of the piezoelectric elements, the greater is the vibration of the piezoelectric elements 33. As seen in FIG. 4, the admittances of the piezoelectric elements 33 increase drastically at certain frequencies, and these frequencies at which the vibrations of the piezoelectric elements 33 increase drastically are the resonance frequencies.

Table 1 was formed using the ATILA™ software to represent the resonance frequencies (Fr) at which the admittances increase drastically, the anti-resonance frequencies, the electromechanical coupling, and the vibration directions in FIG. 4.

TABLE 1

| Resonance Mode | Fr (Hz) | Fa (Hz) | Electromechanical Coupling (%) | Direction |
|---|---|---|---|---|
| first bending | 36307.5 | 36307.8 | 0.37 | B1_x |
| first bending | 36307.5 | 36417.4 | 7.76 | B1_y |
| second bending | 119642 | 119645 | 0.69 | B2_y |
| second bending | 119642 | 120819 | 13.92 | B2_x |
| first longitudinal | 198706 | 199284 | 7.61 | L1 |
| third bending | 199335 | 199393 | 2.43 | B3_x |
| third bending | 199335 | 201690 | 15.24 | B3_y |

As seen in FIG. 4 and Table 1, the piezoelectric vibrator 30 according to the first disclosed embodiment vibrates drastically in the bending direction at resonance frequencies Fr=36307.5, 119642, and 199335 (Hz), and vibrates drastically in the longitudinal direction at Fr=198706 (Hz). Here, since the frequency range for the third bending and first longitudinal vibrations are very similar, electrical signals of this frequency are supplied to the piezoelectric elements 31 to generate vibration.

Here, since the frequency range for the third bending and first longitudinal vibrations are very similar, the piezoelectric elements 31 vibrate in the bending direction and the longitudinal direction, simultaneously. In addition, since the electromechanical coupling is the greatest for the third bending and first longitudinal vibrations, maximum mechanical vibration may occur with electrical signals having the same magnitude. Electromechanical coupling represents the conversion rate between electrical and mechanical energy, and when a large mechanical output (e.g. displacement) is generated for a certain electrical input, it may be said that there is large electromechanical coupling.

Figure 5:
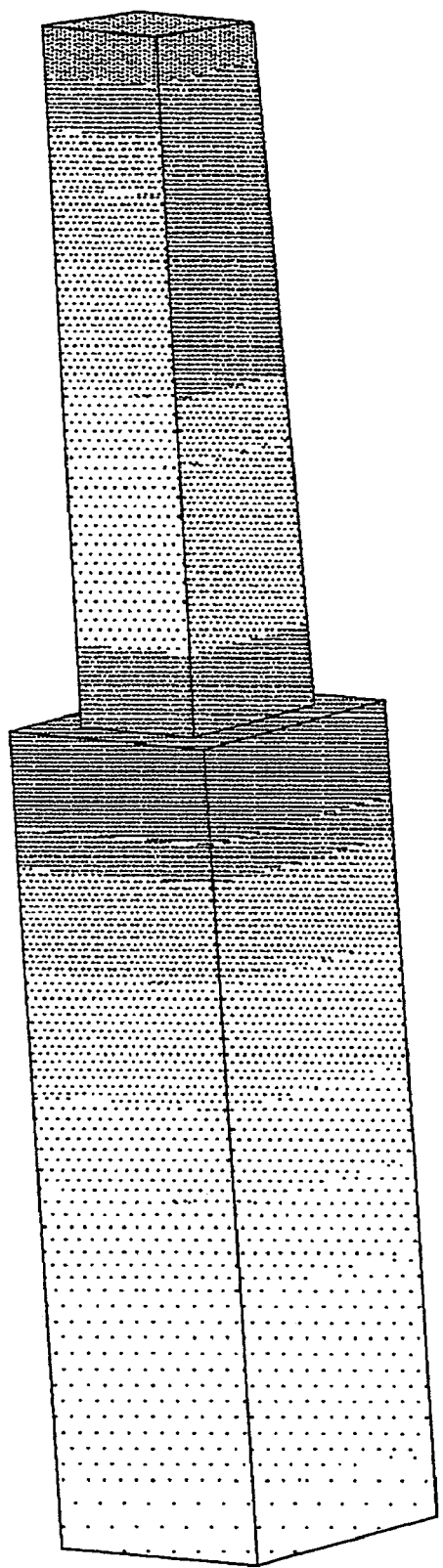
FIG. 5 is an illustration using the ATILA™ software of the longitudinal vibration of a piezoelectric vibrator according to a first disclosed embodiment of the invention.
Figure 6A:
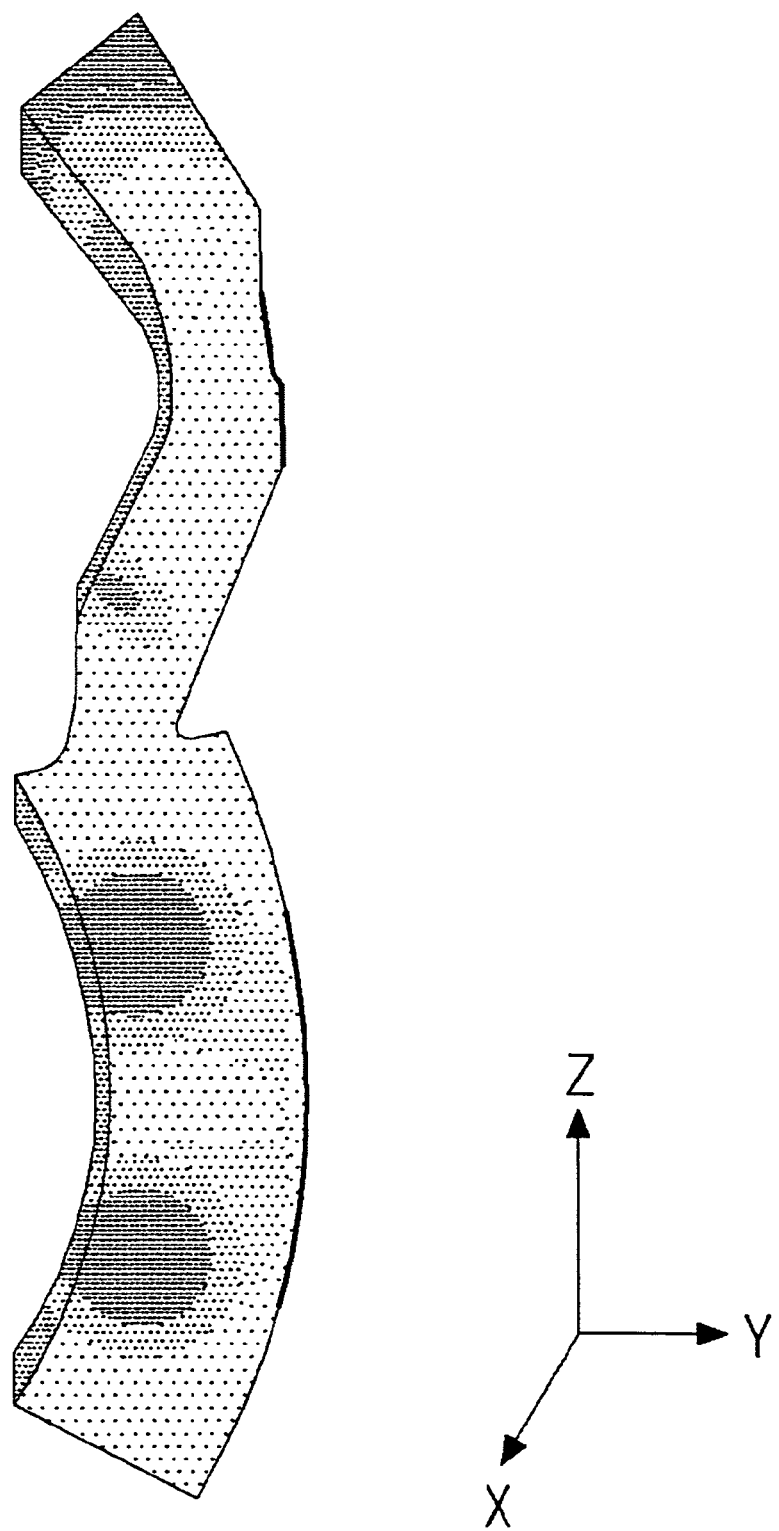
FIG. 6a is an illustration using the ATILA™ software of the bending vibration in the direction of the x-axis of a piezoelectric vibrator according to a first disclosed embodiment of the invention.
Figure 6B:
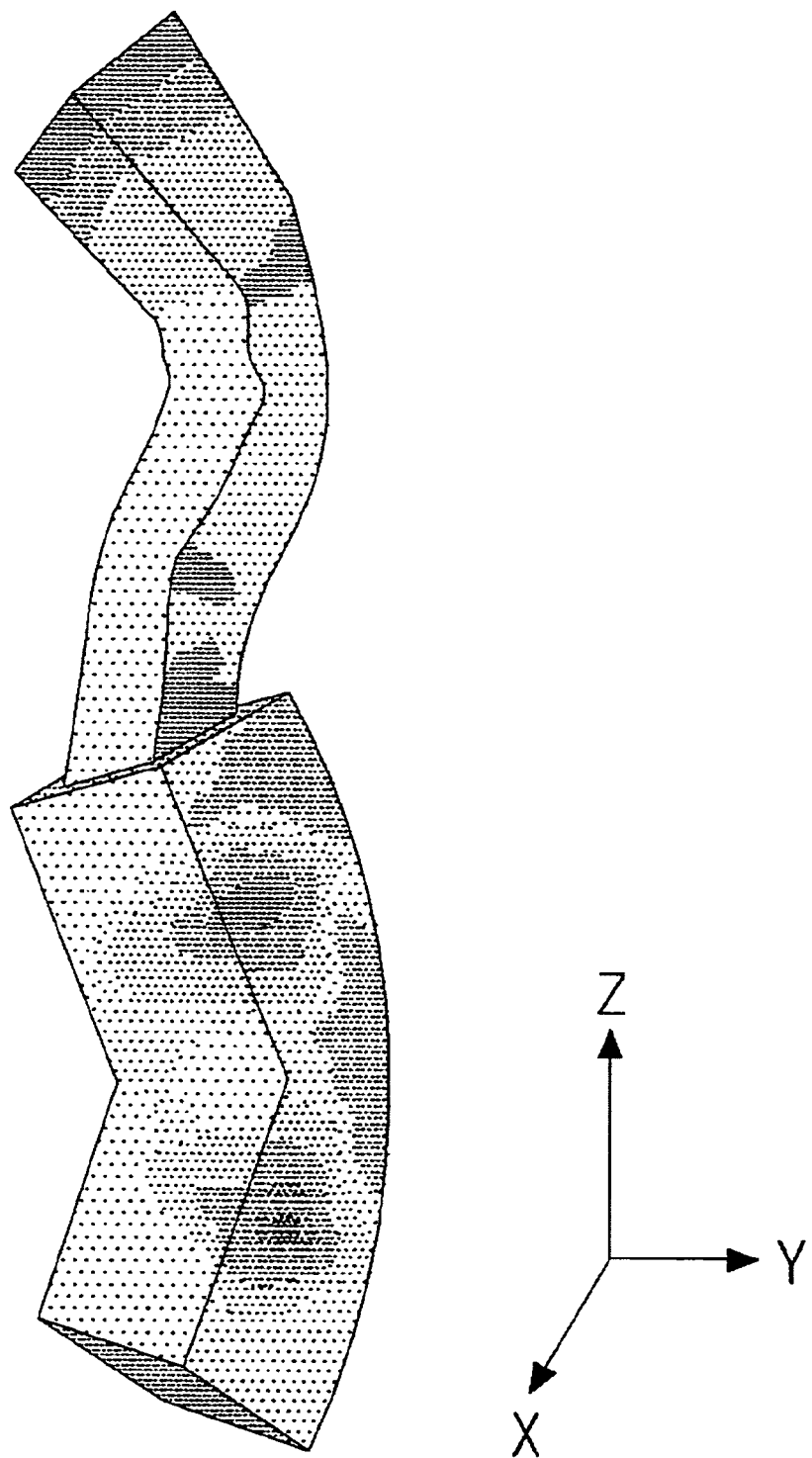
FIG. 6b is an illustration using the ATILA™ software of the bending vibration in the direction of the y-axis of a piezoelectric vibrator according to a first disclosed embodiment of the invention.

FIG. 5 is an illustration using the ATILA™ software of the longitudinal vibration of the piezoelectric vibrator 30 according to the first disclosed embodiment of the invention, and FIGS. 6a and 6b are graphs illustrating the bending vibration of the piezoelectric vibrator 30.

When an electrical signal is inputted to the piezoelectric vibrator 30, the elastic member 33 vibrates in the longitudinal direction (L1 longitudinal) through repetitions of elongation and contraction, as shown in FIG. 5. Here, the frequency number, found using the ATILA™ software, is Fr=198706 (Hz). Also, when a frequency of Fr=199335 (Hz) is inputted, the elastic member 33 undergoes a B3 bending motion with three bends, as shown in FIGS. 6a and 6b. Due to the combination of the L1 longitudinal and the B3 bending vibrations, one end of the elastic member 31 vibrates in an elliptical trajectory.

In the piezoelectric vibrator 30 according to the first disclosed embodiment of the invention, all of the piezoelectric elements 33 vibrate when an electrical signal is inputted, unlike conventional piezoelectric elements, so that not only can the vibration be increased, but also the volume of the piezoelectric vibrator may be decreased.

Figure 7:
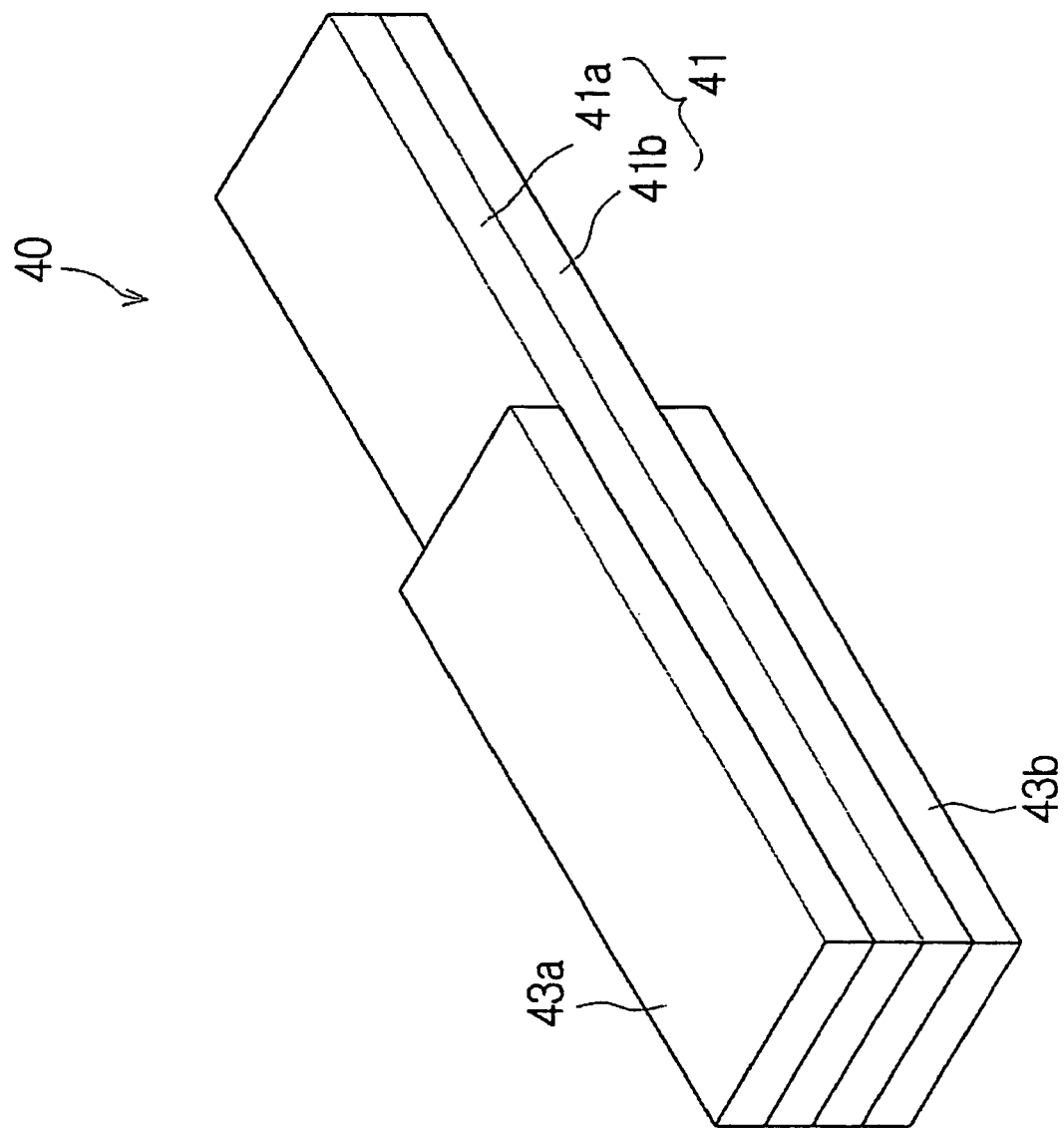
FIG. 7 is a perspective view of a piezoelectric vibrator according to a second disclosed embodiment of the invention.

FIG. 7 is a perspective view of a piezoelectric vibrator 40 according to a second disclosed embodiment of the invention. Referring to FIG. 7, the piezoelectric vibrator 40 according to the second disclosed embodiment comprises first piezoelectric elements 41 having a pair of piezoelectric elements 41a, 41b of equal size, and second piezoelectric elements 43 having a pair of piezoelectric elements 43a, 43b of a shorter length compared to the first piezoelectric elements 41.

The first piezoelectric elements 41 are formed by stacking the pair of identical piezoelectric elements 41a, 41b. The first piezoelectric element 41 is formed from the same piezoelectric ceramics as the piezoelectric element 33 of the first embodiment described above. A conductive electrode (not shown) is formed in-between the first piezoelectric element 41, which supplies electrical signals inputted from an outside source to the first piezoelectric element 41. Also, the attachment surface of the first piezoelectric element 41 is grounded. One end of the first piezoelectric element 41 is in contact with the object of vibration (not shown) to transfer driving power to the object of vibration by means of the longitudinal and bending vibrations.

The second piezoelectric elements 43 are formed as a pair of identical piezoelectric elements 43a, 43b are each attached to a face of the first piezoelectric elements 41a, 41b by means of epoxy resin, etc. In the piezoelectric vibrator 40 of the second disclosed embodiment, one end of the second piezoelectric elements 43 is aligned with one end of the first piezoelectric elements 41. Therefore, similar to the elastic member 31 of the first disclosed embodiment, only one end of the first piezoelectric elements 41 vibrate and transfer vibrational force to the object of vibration.

The second piezoelectric elements 43 are formed from piezoelectric ceramics, with the same thickness and width as the first piezoelectric elements 41. Also, forming the second piezoelectric elements 43 to have half the length of the first piezoelectric elements 41 may maximize the vibration. Conductive electrodes (not shown) are formed on the upper and lower faces of the second piezoelectric elements 43, by which electrical signals supplied from an outside source is transferred to the second piezoelectric elements 43.

Figure 8:
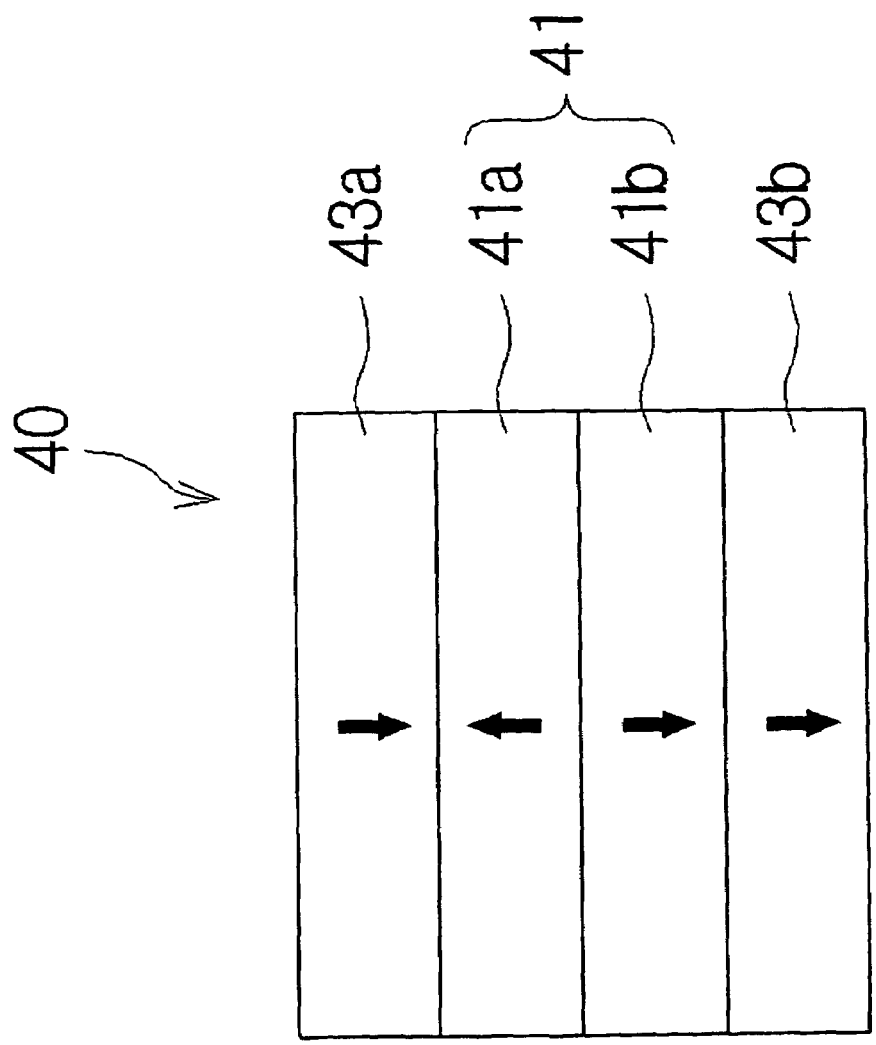
FIG. 8 is a schematic diagram illustrating the polarization directions of piezoelectric elements in a piezoelectric vibrator according to a second disclosed embodiment of the invention.

FIG. 8 is a schematic diagram illustrating the polarization directions of piezoelectric elements 41, 43 in the piezoelectric vibrator 40 according to the second disclosed embodiment of the invention. Referring to FIG. 8, the first piezoelectric elements 41 are polarized in opposite directions, and the second piezoelectric elements 43 are polarized in the same direction. When electrical signals having a phase difference of 90° are inputted to the first piezoelectric elements 41 and second piezoelectric elements 43, the first piezoelectric elements 41 make the whole stator body vibrate in the longitudinal direction, while at the same time the second piezoelectric elements 43 make the whole stator body vibrate in the bending direction. Thus, due to the combination of the longitudinal and bending vibrations, both ends of the first piezoelectric elements 41 vibrate in an elliptical trajectory.

Figure 9A:
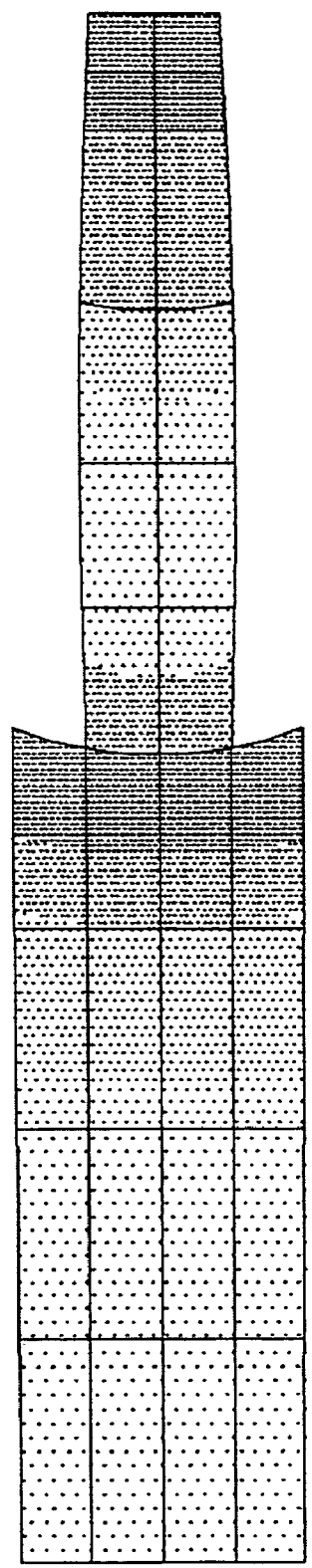
FIG. 9a is an illustration using the ATILA™ software of the longitudinal vibration of a piezoelectric vibrator according to a second disclosed embodiment of the invention.
Figure 9B:
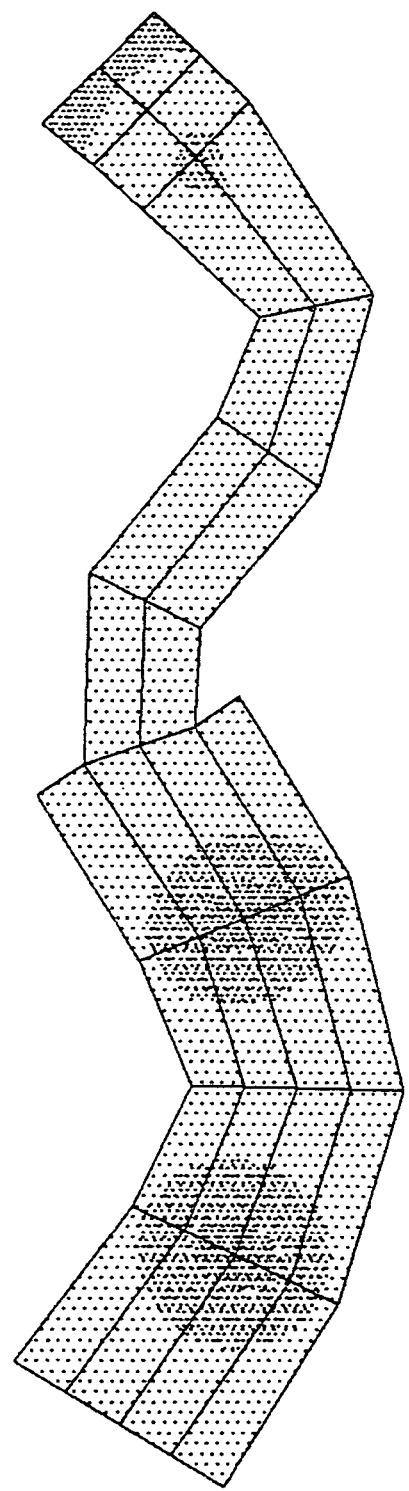
FIG. 9b is an illustration using the ATILA™ software of the bending vibration of a piezoelectric vibrator according to a second disclosed embodiment of the invention.

FIGS. 9a and 9b are graphs using the ATILA™ software to illustrate the vibration of the piezoelectric vibrator according to the second disclosed embodiment of the invention. As seen in FIGS. 9a and 9b, the piezoelectric vibrator 40 according to the second disclosed embodiment is capable of L1 longitudinal and B3 bending vibrations, as in the first disclosed embodiment.

With regards the piezoelectric elements 41, 43 in the piezoelectric vibrator 40 according to the second disclosed embodiment, it is seen that the manufacture of the piezoelectric elements is made easier, as each piezoelectric element 41a, 41b, 43a, 43b has the same polarization direction. Also, since the first piezoelectric elements 41 and the second piezoelectric elements 43 vibrate simultaneously, the piezoelectric vibrator may have a simple structure, with improved vibration performance, while the volume of the piezoelectric vibrator 40 may be decreased. Further, with the piezoelectric vibrator 40 according to the second disclosed embodiment, vibration is generated by the piezoelectric elements 41, 43 only, to allow high efficiency and easy manufacture.

Figure 10:
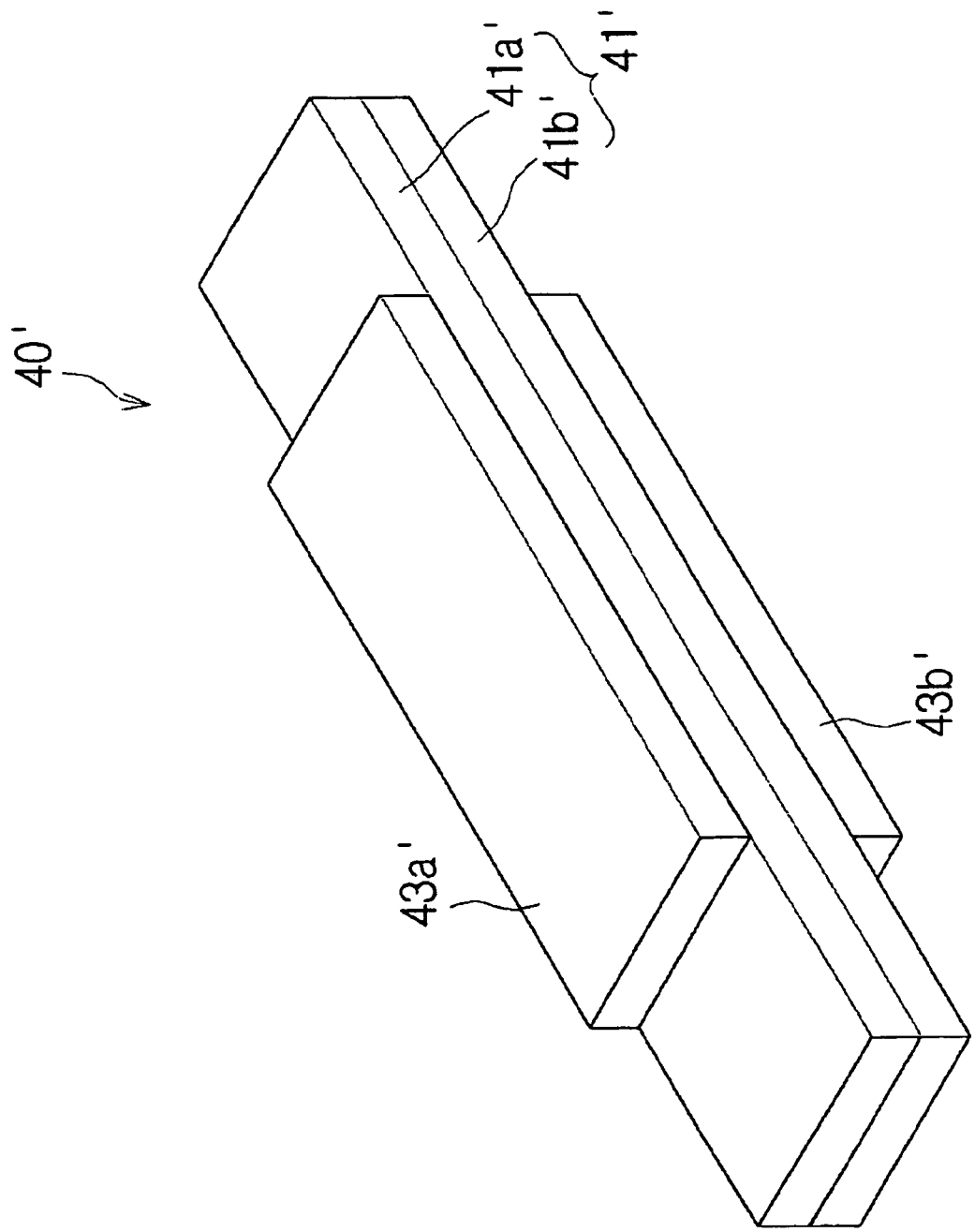
FIG. 10 is a perspective view of a piezoelectric vibrator according to a third disclosed embodiment of the invention.

FIG. 10 is a perspective view of a piezoelectric vibrator 40' according to a third disclosed embodiment of the invention. Referring to FIG. 10, the piezoelectric vibrator 40' according to the third disclosed embodiment comprises first piezoelectric elements 41' having a pair of piezoelectric elements 41a', 41b' of equal size, and second piezoelectric elements 43' having a pair of piezoelectric elements 43a', 43b' of a shorter length compared to the first piezoelectric elements 41'.

The composition of the first piezoelectric elements 41' and the second piezoelectric elements 43' are identical to the first piezoelectric elements 41 and the second piezoelectric elements 43 in the piezoelectric elements of the second disclosed embodiment described above. The difference from the second disclosed embodiment is that the second piezoelectric elements 43' are positioned at the center of the first piezoelectric elements 41'.

The lengthwise center of the second piezoelectric elements 43' coincides with the lengthwise center of the first piezoelectric elements 41'. Therefore, when electrical signals are inputted to the first piezoelectric elements 41' and the second piezoelectric elements 43', both ends of the first piezoelectric elements 41' vibrate in elliptical trajectories.

Figure 11:
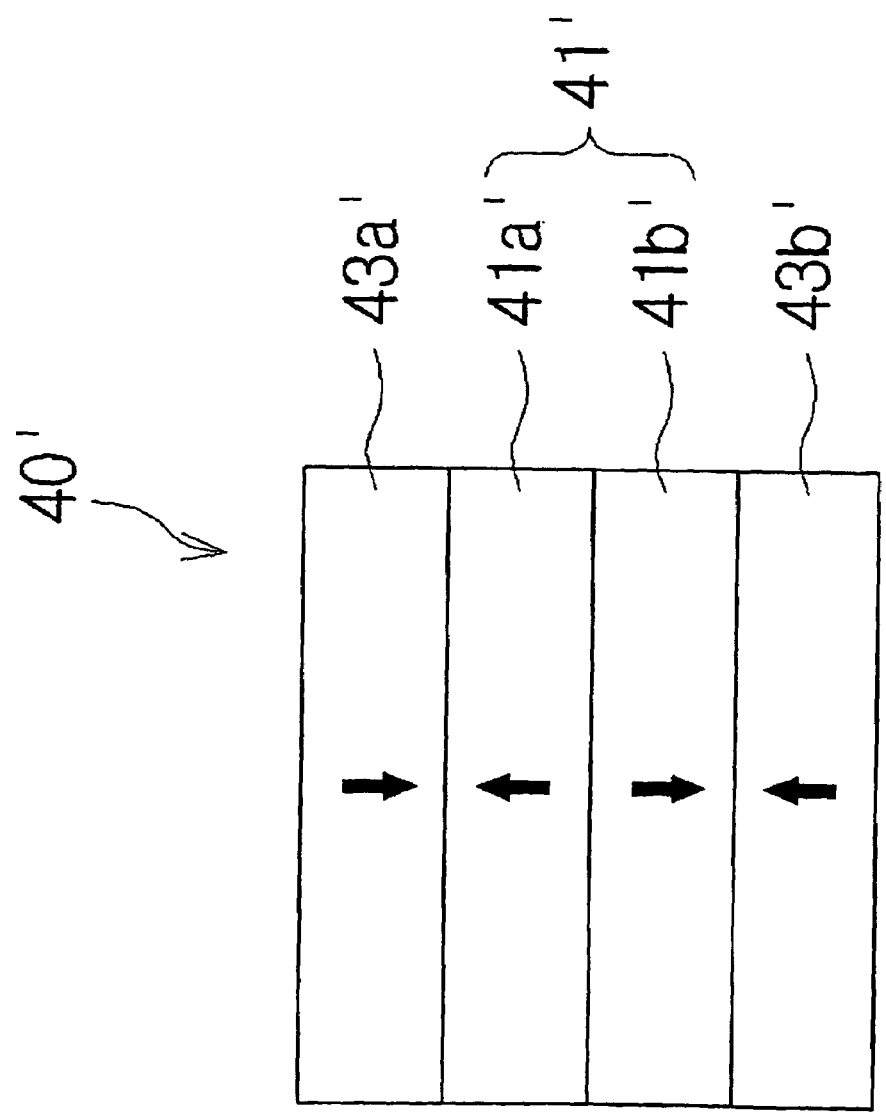
FIG. 11 is a schematic diagram illustrating the polarization directions of piezoelectric elements in a piezoelectric vibrator according to a third disclosed embodiment of the invention.

FIG. 11 is a schematic diagram illustrating the polarization directions of the piezoelectric elements 41', 43' in the piezoelectric vibrator 40' according to the third disclosed embodiment of the invention. Referring to FIG. 11, the first piezoelectric elements 41' are polarized in opposite directions, and the second piezoelectric elements 43' are polarized in the same direction, which is the same as the polarization directions of the piezoelectric elements of the second disclosed embodiment.

Figure 12A:
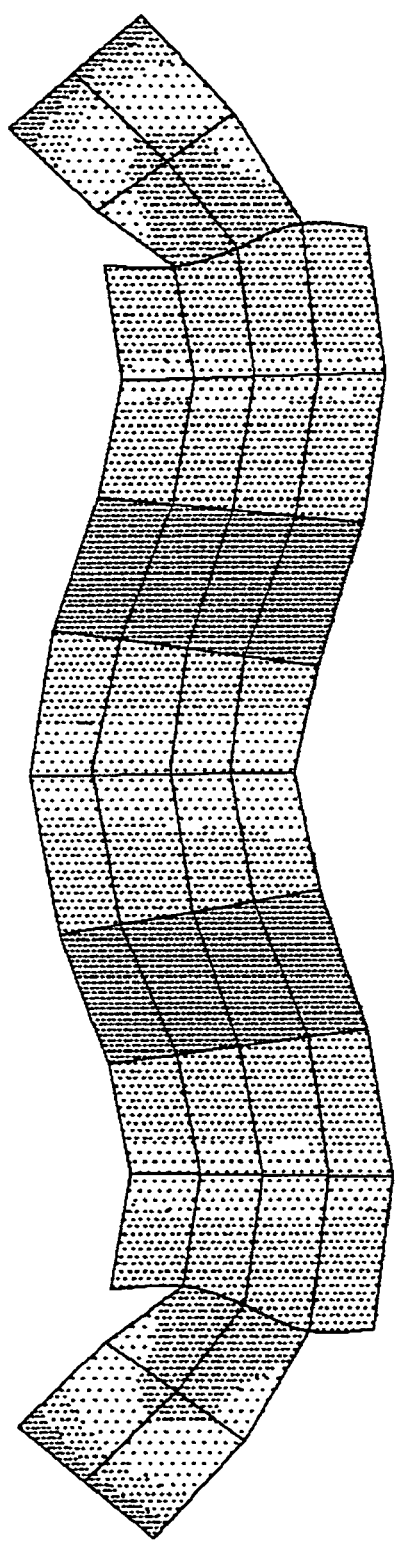
FIG. 12a is an illustration using the ATILA™ software of the longitudinal vibration of a piezoelectric vibrator according to a third disclosed embodiment of the invention.
Figure 12B:
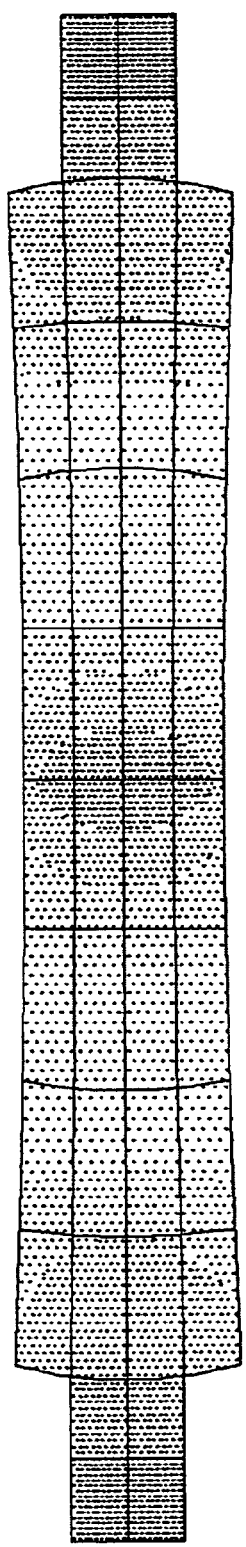
FIG. 12b is an illustration using the ATILA™ software of the bending vibration of a piezoelectric vibrator according to a third disclosed embodiment of the invention.

FIGS. 12a and 12b are illustrations using the ATILA™ software of the vibration of the piezoelectric vibrator 40' according to the third disclosed embodiment. As illustrated in FIGS. 12a and 12b, the piezoelectric vibrator 40' according to the third disclosed embodiment undergoes L1 longitudinal and B3 bending vibrations, as do the piezoelectric vibrators of the first and second disclosed embodiments described above. Both ends of the first piezoelectric elements 41' vibrate simultaneously in elliptical trajectories.

With regards the piezoelectric elements 41', 43' in the piezoelectric vibrator 40' according to the third disclosed embodiment, it is seen that the manufacture of the piezoelectric elements is made easier, as each piezoelectric element 41a', 41b', 43a', 43b' has the same polarization direction. Also, since the first piezoelectric elements 41' and the second piezoelectric elements 43' vibrate simultaneously, the piezoelectric vibrator may have a simple structure, with improved vibration performance, while the volume of the piezoelectric vibrator 40' may be decreased. Further, with the piezoelectric vibrator 40' according to the second disclosed embodiment, vibration is generated by the piezoelectric elements 41', 43' only, to allow high efficiency and easy manufacture.

Figure 13:
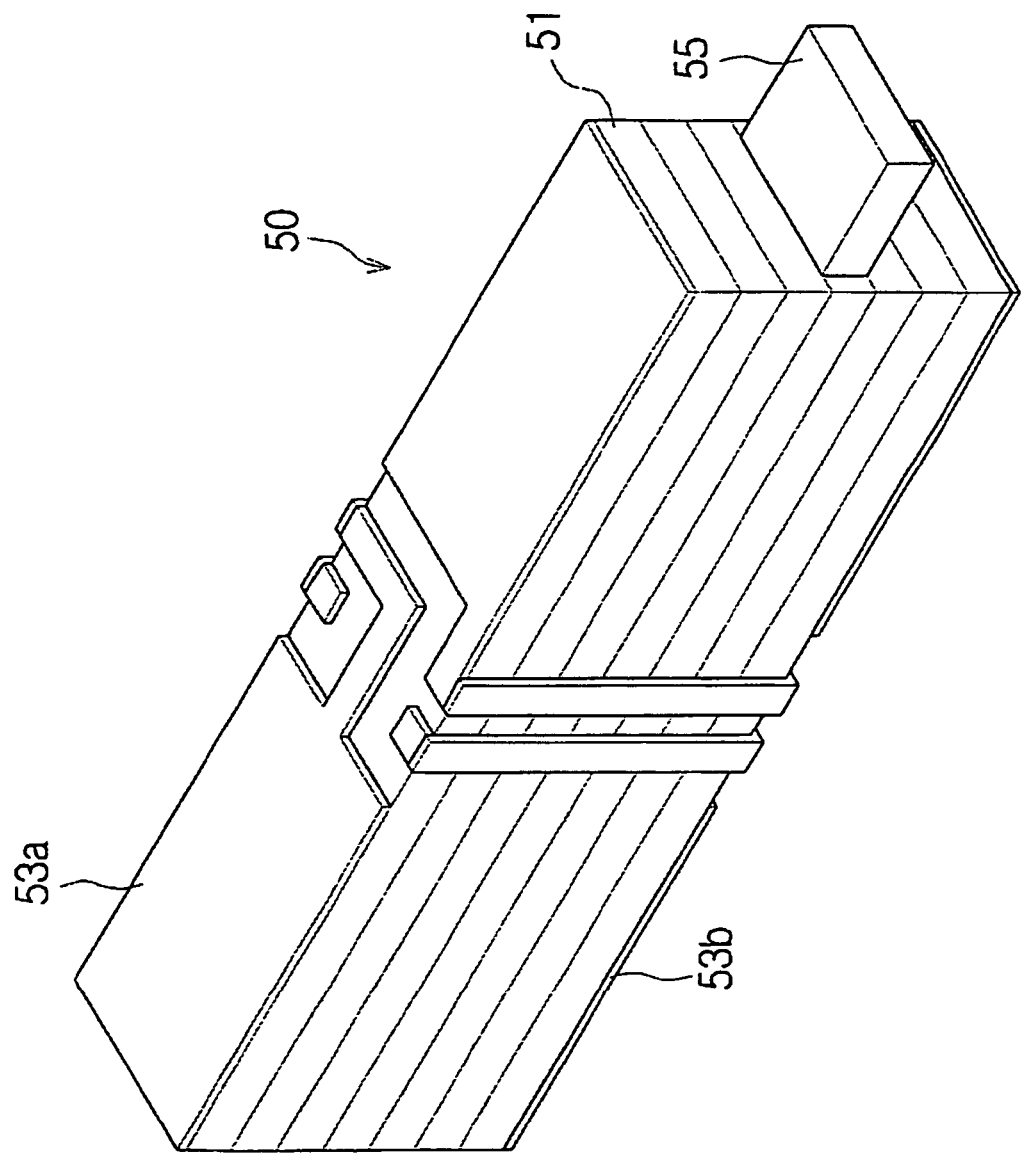
FIG. 13 is a perspective view of a piezoelectric vibrator according to a fourth disclosed embodiment of the invention.

FIG. 13 is a perspective view of a piezoelectric vibrator 50 according to a fourth disclosed embodiment of the invention. The piezoelectric vibrator 50 according to the fourth disclosed embodiment comprises identical piezoelectric elements 51 stacked in multiple layers, conductive electrodes 53 formed between the piezoelectric elements 51, and a protrusion part 55 protruded from one side of the piezoelectric elements 51.

The piezoelectric elements 51 have equal sizes and are stacked in multiple layers. The piezoelectric elements 51 are formed from the same piezoelectric ceramics as in the piezoelectric elements 33, 41, 41' of the first to third disclosed embodiments described above. Electrodes are formed on both faces of the piezoelectric element 51 which supply electrical signals to the piezoelectric element 51. Although in FIG. 13 the piezoelectric elements 51 are formed in seven layers, the present invention is not thus limited, and a stack of six or less or eight or more layers may be used, depending on the size of the piezoelectric elements 51 and desired amount of vibration, etc.

The protrusion part 55 protrudes from a side of the piezoelectric element 51 to the exterior by a predetermined length. The protrusion part 55 vibrates in an elliptical trajectory, due to the vibration of the piezoelectric elements 51 in the longitudinal and bending directions. As the protrusion part 55 is in contact with the object of vibration (not shown), the object of vibration is made to vibrate by means of the protrusion part 55.

Since the protrusion part 55 transfers driving power using frictional force with the object of vibration, a wear-resistant member may be formed on the protrusion part 55. The wear-resistant member may include various materials containing glass materials, such as soda, lead, borates (e.g. Pyrex™), crowns, flint, heavy flint, and quartz glass, etc., or ceramic materials, such as alumina, zirconium oxides, silicon carbides, silicon nitrides, tungsten carbide, and titanium carbide, etc.

Figure 14:
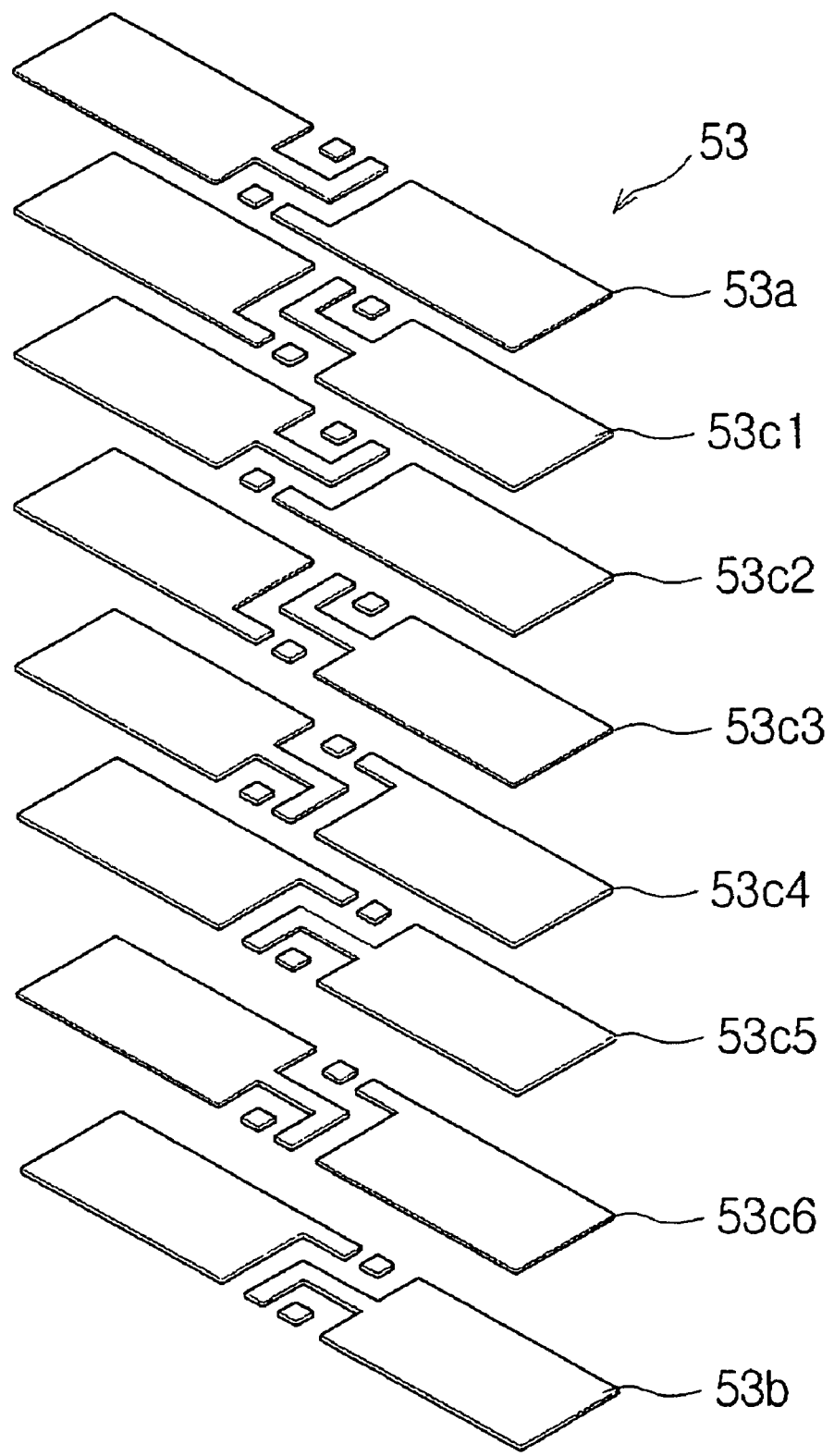
FIG. 14 is a perspective view of an example of conductive electrodes in a piezoelectric vibrator according to a fourth disclosed embodiment of the invention.

FIG. 14 is a perspective view of an example of the conductive electrodes 53 in the piezoelectric vibrator 50 according to the fourth disclosed embodiment of the invention. Referring to FIG. 14, the electrodes 53 include an upper electrode 53a formed on the uppermost face of the piezoelectric elements 51, a lower electrode 53b formed on the lowermost face, and a first to sixth inner electrodes 53c1, 53c2, 53c3, 53c4, 53c5, 53c6 stacked orderly on the faces of the piezoelectric elements 51.

As shown in FIG. 14, the upper electrode 53a and the second inner electrode 53c2 have identical patterns, and the first inner electrode 53c1 and the third inner electrode 53c3 have identical patterns. Also, the fourth inner electrode 53c4 and the sixth inner electrode 53c6 have identical patterns, and the fifth inner electrode 53c5 and the lower electrode 53b have identical patterns. Further, the first inner electrode 53c1 and third inner electrode 53c3 have a pattern symmetrical to the fourth inner electrode 53c4 and sixth inner electrode 53c6 in the length and width directions of the electrodes. Also, the upper electrode 53a and second inner electrode 53c2 are symmetrical to the lower electrode 53b and fifth inner electrode 53c5 in the length and width directions of the electrodes. The upper electrode 53a, the lower electrode 53b and the first to sixth inner electrodes 53c1, 53c2, 53c3, 53c4, 53c5, 53c6 are used to polarize the piezoelectric element 51 and supply electrical signals. The electrodes 53 according to the fourth disclosed embodiment are not limited to those shown in FIG. 14, and it is apparent that a variety of modifications may be made by the skilled person.

Sin and −sin are inputted to the upper electrode 53a, and cos and −cos are inputted to the lower electrode 53b. Thus, electrical signals having four phases are inputted to the piezoelectric vibrator 50 according to the fourth disclosed embodiment. Since sin and −sin and cos and −cos are inputted to the upper electrode 53a and the lower electrode 53b, the input of electrical signals with a relative magnitude of 2 sin (or 2 cos) may be effected.

Figure 15:
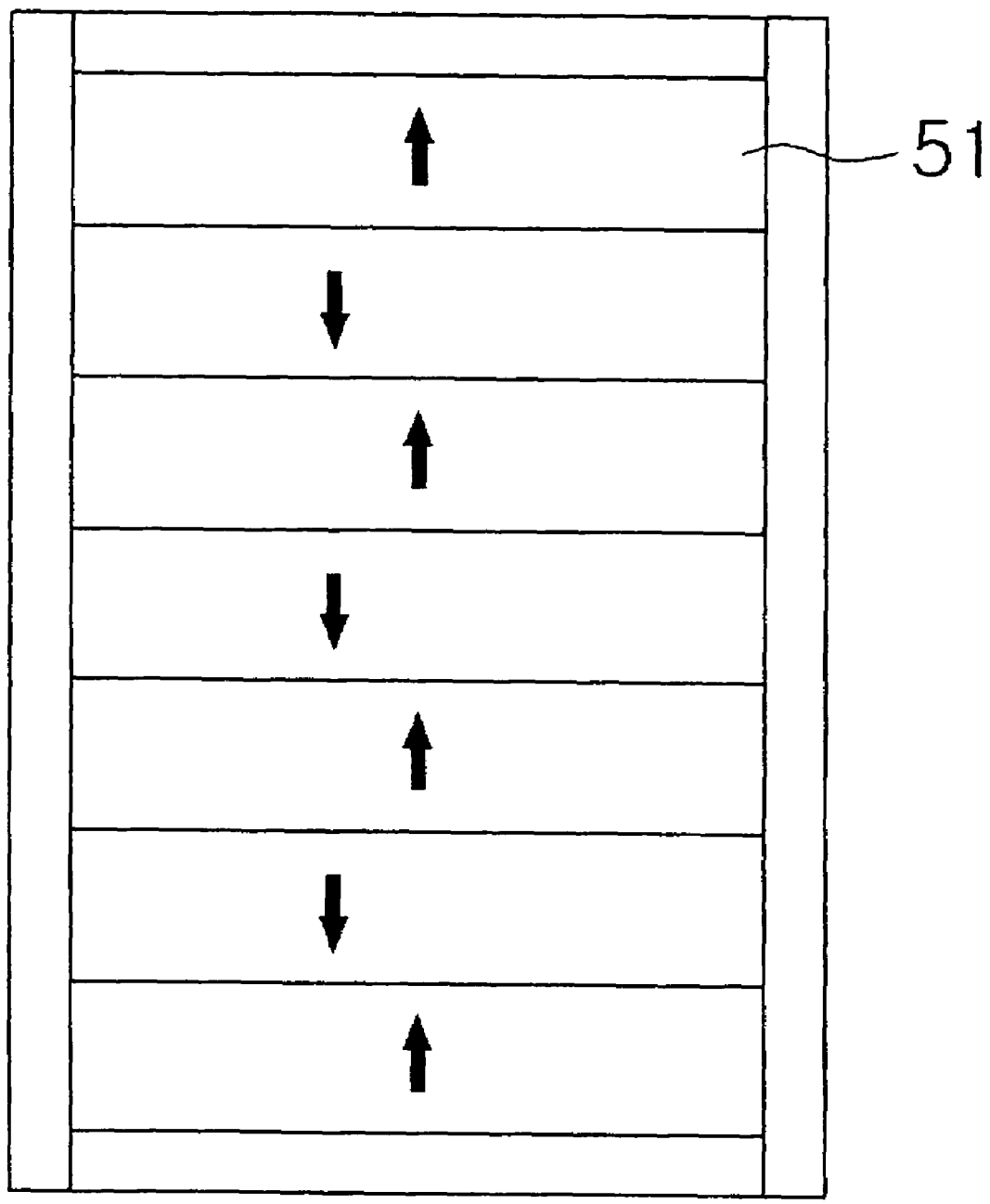
FIG. 15 is a schematic diagram illustrating the polarization directions of piezoelectric elements in a piezoelectric vibrator according to a fourth disclosed embodiment of the invention.

FIG. 15 is a schematic diagram illustrating the polarization directions of piezoelectric elements 51 in the piezoelectric vibrator 50 according to the fourth disclosed embodiment. As shown in FIG. 15, all adjacent piezoelectric elements 51 are polarized in opposite directions. Also, each of the piezoelectric elements 51 has one polarization direction.

Figure 16A:
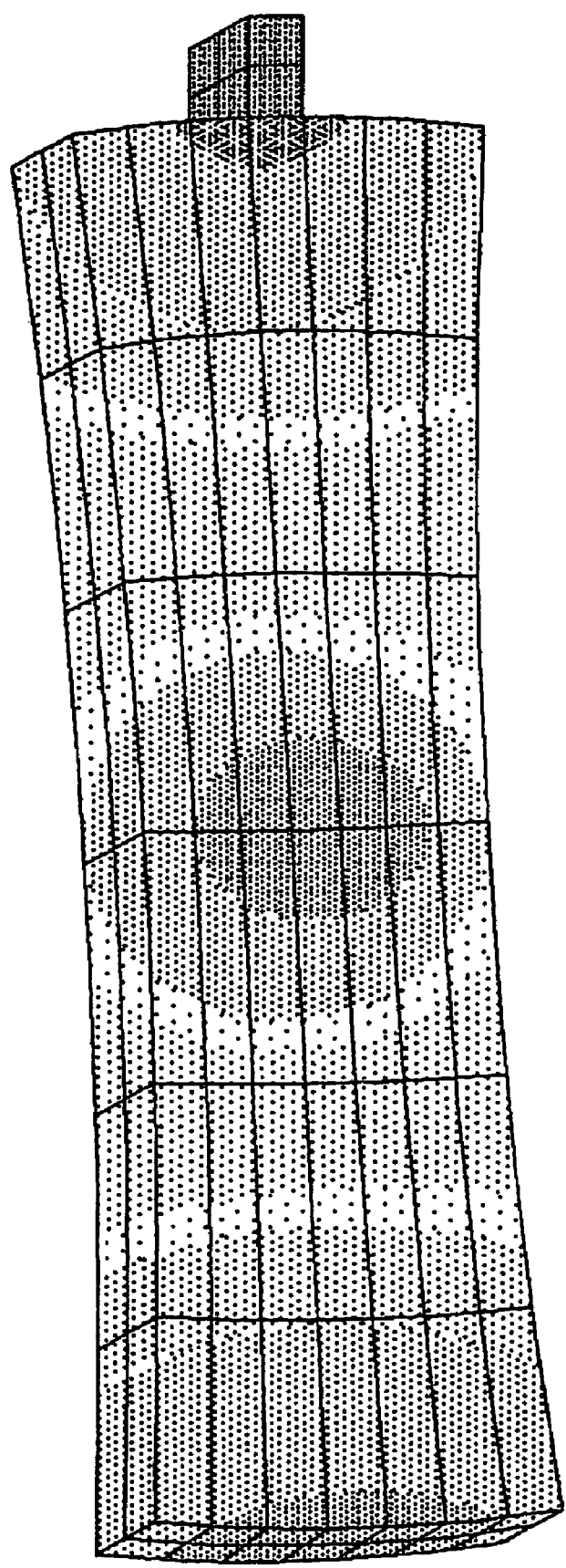
FIG. 16a is an illustration using the ATILA™ software of the longitudinal vibration of a piezoelectric vibrator according to a fourth disclosed embodiment of the invention.
Figure 16B:
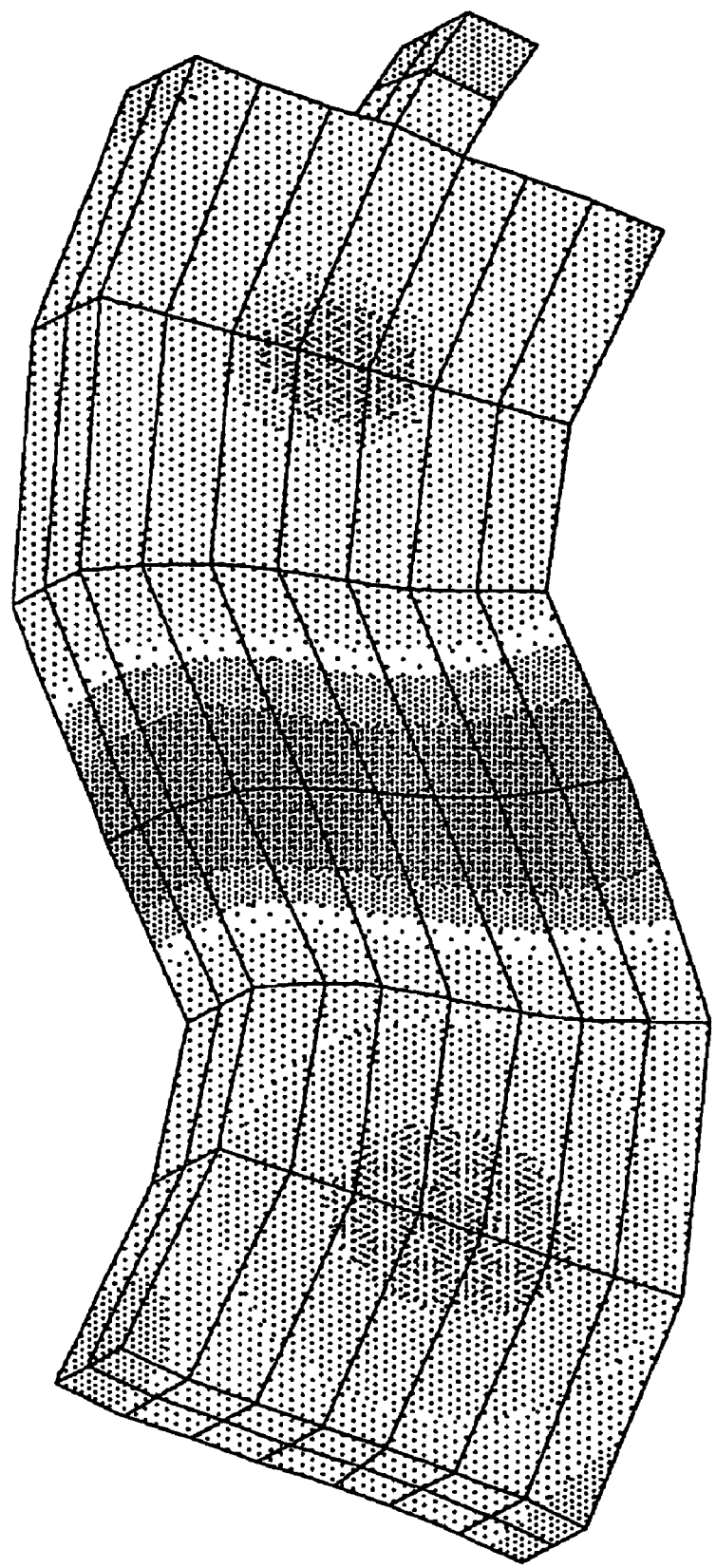
FIG. 16b is an illustration using the ATILA™ software of the bending vibration of a piezoelectric vibrator according to a fourth disclosed embodiment of the invention.

FIGS. 16a and 16b are illustrations using the ATILA™ software of the vibration of the piezoelectric vibrator 50 according to the fourth disclosed embodiment. As shown in FIGS. 16a and 16b, the piezoelectric vibrator 50 according to the fourth disclosed embodiment vibrates in the longitudinal direction at 265 kHz, and vibrates in B2 mode in the bending direction at 267 kHz. Therefore, as the frequency band ranges are the same, the piezoelectric vibrator 50 vibrates simultaneously.

Since all of the piezoelectric elements 51 in each layer of the piezoelectric vibrator 50 according to the fourth disclosed embodiment have a uniform polarization direction, it is seen that the manufacture of the piezoelectric elements is made easier. Moreover, since all of the piezoelectric elements 51 vibrate simultaneously, the piezoelectric vibrator may have a simple structure, with improved vibration performance, while the volume of the piezoelectric vibrator 50 may be decreased.

Hereinafter, an ultrasonic motor 70 according to a fifth disclosed embodiment of the invention will be described with reference to FIGS. 17 to 19.

Figure 17:
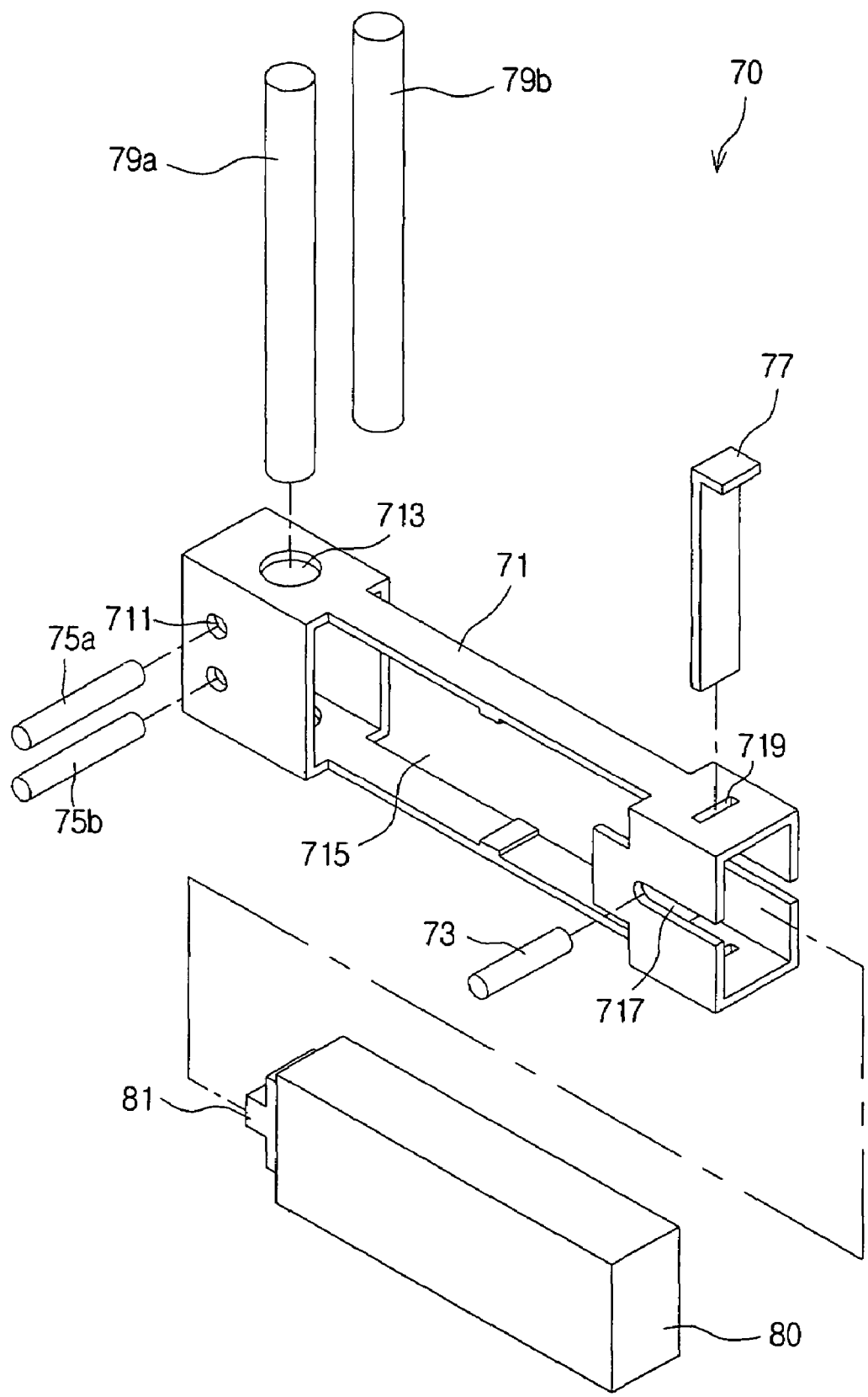
FIG. 17 is an exploded perspective view of an ultrasonic motor according to a fifth disclosed embodiment of the invention.
Figure 18:
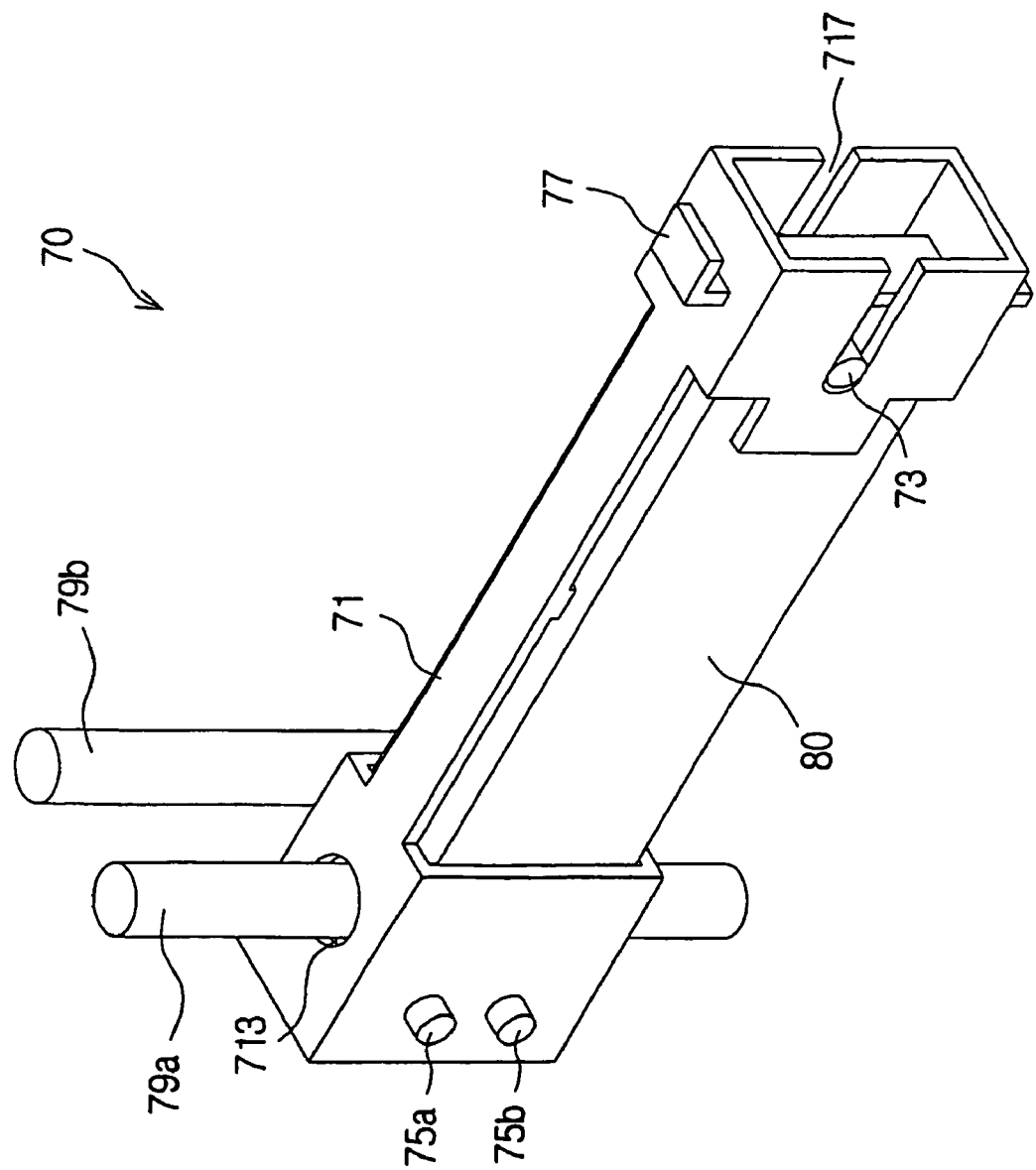
FIG. 18 is an assembled perspective view of an ultrasonic motor according to a fifth disclosed embodiment of the invention.

FIG. 17 is an exploded perspective view of the ultrasonic motor 70 according to the fifth disclosed embodiment of the invention, and FIG. 18 is a perspective view representing the ultrasonic motor 70 illustrated in FIG. 17 in its assembled state. FIG. 19 is an assembled cross-sectional view of the ultrasonic motor of FIGS. 17 and 18.

Referring to FIG. 17, an ultrasonic motor 70 based on an aspect of the present invention comprises a case 71, a piezoelectric vibrator 80 inserted into the case, a first pressing member 73 pressing the rear end of the piezoelectric vibrator 80, second pressing members 75 pressing the sliders 79a, 79b, and a flat spring 77 pressing the first pressing member 73.

The case 71 houses the piezoelectric vibrator 80, first pressing member 73, second pressing members 75, flat spring 77, and sliders 79a, 79b. The case 71 comprises a vibrator housing part 715 into which the piezoelectric vibrator 80 is inserted, slider insertion holes 713 holding the sliders 79a, 79b, first pressing member fitting grooves 717 into which the first pressing member 73 is inserted, second pressing member insertion holes 711 through which the second pressing members 75 are inserted, and spring insertion grooves 719 through which the flat spring 77 is inserted.

The vibrator housing part 715 is formed in the center of the case 71. Although both ends of the piezoelectric vibrator 80 are isolated by the case 71 from the exterior, the other parts are exposed to the exterior. The piezoelectric vibrator 80 is inserted into and fixed in the vibrator housing part 715. The slider insertion holes 713 lead to the vibrator housing part 715.

A portion of the sliders 79a, 79b is inserted through the slider insertion holes 713. Since the diameter of the slider insertion holes 713 is somewhat greater than the diameter of the sliders 79a, 79b, the sliders 79a, 79b may freely ascend and descend. The slider insertion holes 713 lead to the vibrator housing part 715 and are formed perpendicularly to the second pressing member insertion holes 711.

Both ends of the second pressing members 75a, 75b are inserted through the second pressing member insertion holes 711. The first pressing member fitting grooves 717 are grooves formed at one end of the case 71 in the length direction having the shape of slots with the ends on one side open. The first pressing member 73 is fitted into the first pressing member fitting grooves 717 to press the rear side of the piezoelectric element 80 inserted into the vibrator housing part 715. The spring insertion grooves 719 are grooves formed on the case 71 in a vertical direction, and the flat spring 77 inserted into the spring insertion grooves 719 presses the first pressing member 73.

A piezoelectric vibrator 30, 40, 40' 50 according to the first to fourth disclosed embodiments may be used for the piezoelectric vibrator 80. A protrusion part 81 is formed on one end of the piezoelectric vibrator 80, where the protrusion part 81 moves the sliders 79a, 79b in vertical directions using frictional force. The composition of the piezoelectric vibrator 80 is the same as in the first to fourth disclosed embodiments, so that detailed explanations are omitted.

The sliders 79 include a first slider 79a inserted through the slider insertion holes 713 to contact the protrusion part 81 of the piezoelectric element 80, and a second slider 79b which guides the first slider 79a to prevent it from rotating. Since the first slider 79a, as shown in FIG. 19, is in contact with the protrusion part 81 of the piezoelectric vibrator 80, it moves in vertical directions due to the vibration of the protrusion part 81.

The first pressing member 73 is a rod having a circular cross section. The first pressing member 73, as shown in FIG.

19, is in line-contact with the piezoelectric vibrator 80. Thus, the first pressing member 73 may press the piezoelectric vibrator 80 exactly perpendicularly. The first pressing member 73 is prevented from being dislodged from the first pressing member fitting grooves 717 by the flat spring 77.

Figure 19:
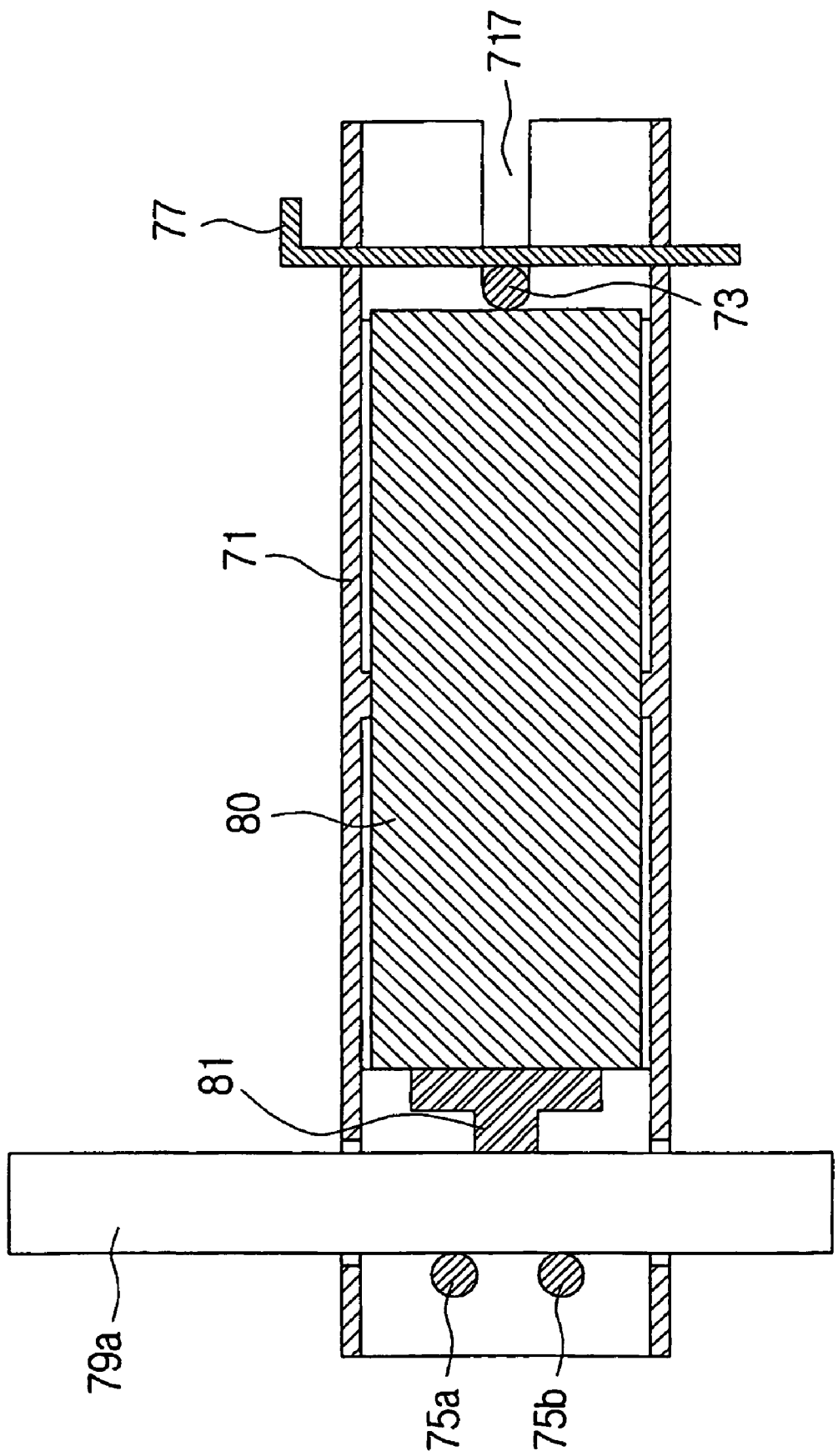
FIG. 19 is a cross-sectional view of an ultrasonic motor according to a fifth disclosed embodiment of the invention.

The second pressing members 75 are rods having circular cross sections inserted through the second pressing member insertion holes 711 and, as shown in FIG. 19, presses the first slider 79*a* towards the piezoelectric vibrator 80. The second pressing members 75 may be formed in numbers of three or greater. The flat spring 77 presses the first pressing member 73 towards the sliders 79 by means of elastic force. Thus, the protrusion part 81 of the piezoelectric vibrator 80 and the first slider 79*a* are always in contact.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

According to an aspect of the present invention, the embodiments of which are as set forth above, a piezoelectric vibrator and an ultrasonic motor having the piezoelectric vibrator may be provided, with which the manufacturing time and cost may be reduced, as it is not necessary to go through two polarization processes.

According to another aspect of the present invention, a piezoelectric vibrator and an ultrasonic motor having the piezoelectric vibrator may be provided, with which the decline in performance due to the depolarization of the piezoelectric elements is removed.

According to yet another aspect of the present invention, a piezoelectric vibrator and an ultrasonic motor having the piezoelectric vibrator may be provided, with the volume decreased and the vibration performance improved.

What is claimed is:

1. An ultrasonic motor comprising:
   a piezoelectric vibrator, comprising
      an elastic member having a quadrilateral cross section; and
      piezoelectric elements, attached to each side of the elastic member and vibrating the elastic member in a longitudinal direction and a bending direction when an electrical signal is inputted, wherein the piezoelectric elements have the same size and are shorter than the elastic member;
   a case, into which the piezoelectric vibrator is inserted;
   a slider, inserted into the case to be movable in vertical directions, and moving in contact with the piezoelectric vibrator;
   a first pressing member to press the piezoelectric vibrator towards the slider; and
   a second pressing member to press the slider towards the piezoelectric vibrator.

2. The ultrasonic motor of claim 1, wherein the piezoelectric elements comprise two pairs of piezoelectric elements, one pair of piezoelectric elements being attached to opposing sides of the elastic member and polarized in the same direction, and the other pair being polarized in the opposite directions.

3. The ultrasonic motor of claim 1, wherein one end of the piezoelectric elements are aligned with one end of the elastic member.

4. The ultrasonic motor of claim 1, wherein one edge of each of the piezoelectric elements is trimmed, and the piezoelectric elements are positioned with the trimmed edge facing outward.

5. The ultrasonic motor of claim 1, wherein the length of the elastic member is twice the length of the piezoelectric elements.

6. The ultrasonic motor of claim 1, wherein voltages with a phase difference of 90° are supplied respectively to the one pair of piezoelectric elements attached to opposing sides of the elastic member and the other pair of piezoelectric elements.

7. The ultrasonic motor of claim 1, further comprising a flat spring inserted into the case, wherein the first pressing member has a circular cross section and is pressed towards the sliders by the flat spring inserted into the case.

8. The ultrasonic motor of claim 7, wherein the case comprises:
   a vibrator housing part into which the piezoelectric vibrator is inserted;
   slider insertion holes leading to the vibrator housing part through which the sliders are inserted;
   first pressing member fitting grooves formed on one end of the case in a predetermined depth into which the first pressing member is inserted to contact one end of the piezoelectric vibrator;
   second pressing member insertion holes formed perpendicularly to the slider insertion holes through which the second pressing member is inserted to contact the slider; and
   spring insertion grooves formed perpendicularly to the first pressing member fitting grooves through which the flat spring is inserted to contact the first pressing member.

* * * * *

UNITED STATES PATENT AND TRADEMARK OFFICE
CERTIFICATE OF CORRECTION

| | | |
|---|---|---|
| PATENT NO. | : 7,644,619 B2 | Page 1 of 1 |
| APPLICATION NO. | : 11/436770 | |
| DATED | : January 12, 2010 | |
| INVENTOR(S) | : Burhanettin Koc et al. | |

It is certified that error appears in the above-identified patent and that said Letters Patent is hereby corrected as shown below:

Column 14, Lines 9-10, change "directions." to --direction.--.

Signed and Sealed this

Sixth Day of April, 2010

David J. Kappos
*Director of the United States Patent and Trademark Office*